US011757441B2

(12) United States Patent
Balaz

(10) Patent No.: US 11,757,441 B2
(45) Date of Patent: *Sep. 12, 2023

(54) METHODS AND APPARATUS TO IMPLEMENT CURRENT LIMIT TEST MODE

(71) Applicant: Texas Instruments Incorporated, Dallas, TX (US)

(72) Inventor: Pavol Balaz, Freising (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 43 days.

This patent is subject to a terminal disclaimer.

(21) Appl. No.: 17/228,981

(22) Filed: Apr. 13, 2021

(65) Prior Publication Data

US 2021/0234540 A1   Jul. 29, 2021

Related U.S. Application Data

(63) Continuation of application No. 16/670,720, filed on Oct. 31, 2019, now Pat. No. 11,095,282.

(60) Provisional application No. 62/775,668, filed on Dec. 5, 2018.

(51) Int. Cl.
   *H03K 3/00* (2006.01)
   *H03K 17/0812* (2006.01)
   *H02M 3/07* (2006.01)

(52) U.S. Cl.
   CPC ......... *H03K 17/08122* (2013.01); *H02M 3/07* (2013.01); *H03K 2217/0063* (2013.01)

(58) Field of Classification Search
   CPC .... H03K 17/08122; H03K 2217/0063; H02M 3/07

USPC ........................................................ 327/109
See application file for complete search history.

(56) References Cited

U.S. PATENT DOCUMENTS

| 5,808,883 | A    |   | 9/1998  | Hawkes                      |
|-----------|------|---|---------|-----------------------------|
| 8,994,442 | B2   | * | 3/2015  | Konstantinov ...... H03K 17/164 |
|           |      |   |         | 327/439                     |
| 9,722,483 | B2   | * | 8/2017  | Zuniga .................. H02M 1/088 |
| 10,756,722| B2   | * | 8/2020  | Korner ................. H03K 17/122 |
| 2013/0026829 | A1 |   | 1/2013  | Kartal                      |
| 2014/0217959 | A1 |   | 8/2014  | Chen et al.                 |
| 2015/0022248 | A1 |   | 1/2015  | Fukami                      |
| 2015/0326114 | A1 |   | 11/2015 | Rolland                     |
| 2016/0072382 | A1 |   | 3/2016  | Ranmuthu                    |
| 2017/0338742 | A1 | * | 11/2017 | Veeramreddi ....... H02M 3/1588 |
| 2019/0260373 | A1 | * | 8/2019  | Yang ................. H03K 17/08122 |

(Continued)

*Primary Examiner* — Ryan Jager

(74) *Attorney, Agent, or Firm* — Ray A. King; Frank D. Cimino

(57) ABSTRACT

Methods, apparatus, systems and articles of manufacture are disclosed. An example apparatus includes a gate controller coupled between an input terminal and an intermediate node, the gate controller including a first transistor coupled between the input terminal and a first node; a second transistor coupled between the first node and the intermediate node; a third transistor coupled between the input terminal and the intermediate node; and a charge pump coupled to the intermediate node; a switching network coupled between the intermediate node and an output terminal, the switching network including a high-side drive (HSD) transistor having a HSD gate terminal coupled to the intermediate node, the HSD transistor coupled between an input voltage and a switch node.

8 Claims, 7 Drawing Sheets

(56) References Cited

U.S. PATENT DOCUMENTS

2019/0326806 A1  10/2019  Gong et al.

* cited by examiner

METHODS AND APPARATUS TO IMPLEMENT CURRENT LIMIT TEST MODE

RELATED APPLICATION

This patent is a continuation of U.S. patent application Ser. No. 16/670,720 filed Oct. 31, 2019, which claims benefit of U.S. Provisional Patent Application Ser. No. 62/775,668, filed on Dec. 5, 2018, which Applications are hereby incorporated herein by reference in their entirety.

FIELD OF THE DISCLOSURE

This disclosure relates generally to current limiting, and, more particularly, to implementing current limit test mode.

BACKGROUND

Power converter circuits are used in various devices to convert input voltages to desired output voltages. For example, a buck converter converts an input voltage into a lower, desired output voltage by controlling transistors and/or switches to charge and/or discharge inductors and/or capacitors to maintain the desired output voltage. Such transistors/switches conduct current and, like most devices, have a threshold of current they are able to conduct until the transistor/switch is damaged.

Figure 1:
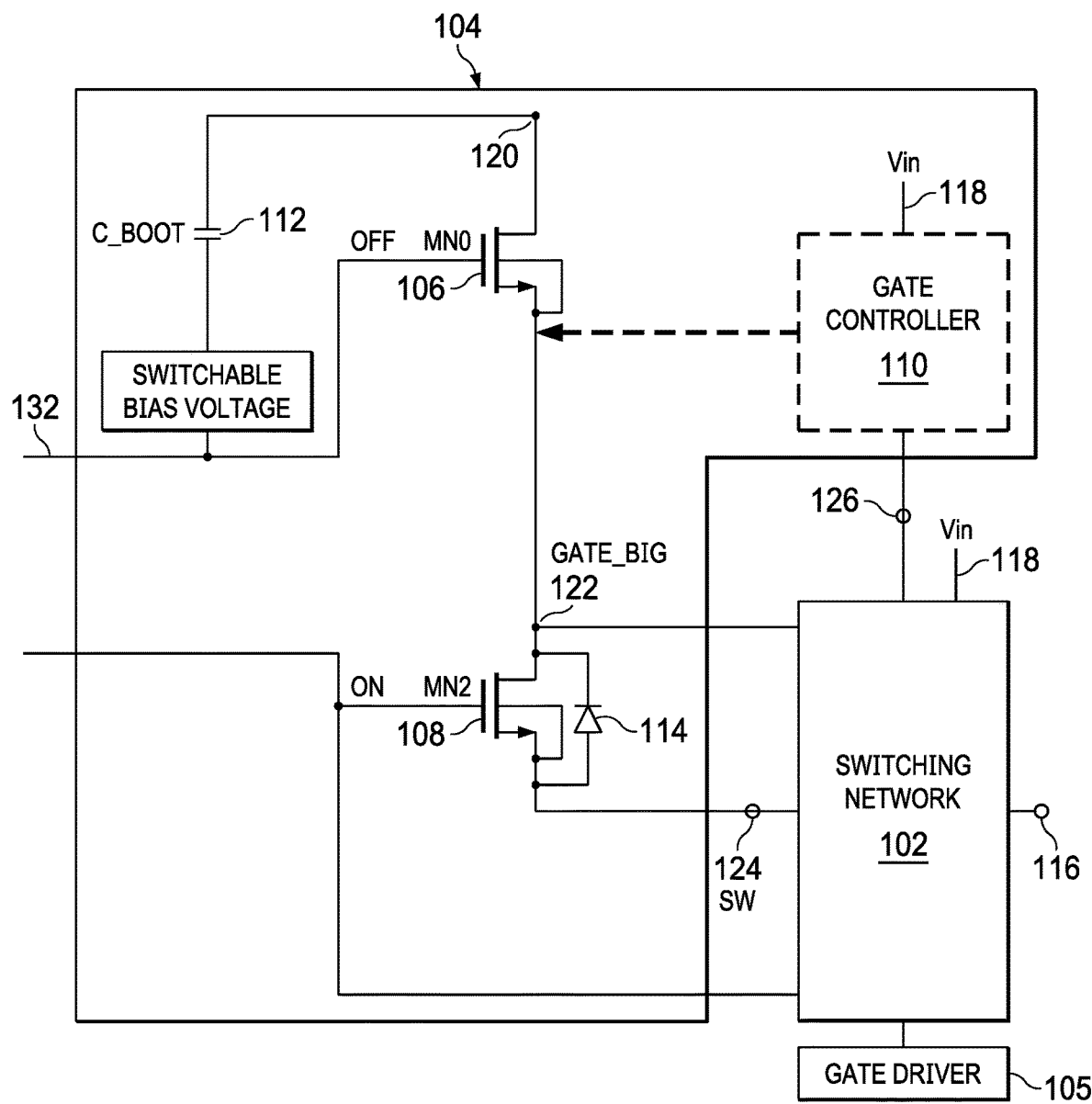
FIG. 1 is a schematic illustration of an example voltage converter apparatus which operates in three modes.

The figures are not to scale. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

Switched mode power converters (e.g., boost converters, buck converters, buck-boost converters, etc.), or power conversion stages, are used to convert a first voltage (e.g., an input voltage) to a second voltage (e.g., an output voltage). Such power converters include a switching network including one or more switching transistors coupled to a switching node that is switched to form circuit arrangements to direct current through an energy storage inductor and/or to charge/discharge an output capacitor. Such circuit arrangements supply load current and regulate the output voltage to remain substantially steady at the second voltage.

In some examples, a buck converter includes two main power transistors. A power transistor, such as a metal-oxide semiconductor field-effect transistor (MOSFET), includes two current terminals and a gate terminal. To turn on the MOSFET (e.g., initiate current conducting through the two current terminals), a voltage is applied to the gate terminal, and the amount of voltage determines the amount of current the MOSFET will conduct. The two main power transistors can conduct an excessive amount of current during a circuit over current (e.g., excess current existing through a conductor leading to excessive generation of heat), a transient (e.g., a large spike of current generated by a load or the start-up of a voltage supply), or a short circuit (e.g., an unintended contact of electrical components such as a voltage directly coupled to ground, resulting in low impedance and high current). When such power transistors conduct excessive amounts of current, they generate heat, sometimes too much heat, and become damaged and therefore stop working as intended. In order to protect such power transistors from conducting excessive current, a current limit is implemented.

A current limit can be implemented by a current limiting circuit. A current limiting circuit is utilized to impose an upper limit on the current that is delivered to the load to protect the power converter, that is transmitting the current, from harmful effects. In some examples, a current limiting circuit turns off (e.g., switches off, removes power, etc.) the power transistor when it senses the current conducting through the transistor has exceeded the upper limit of current. In order to determine if the current limiting circuit is sensing the current conducting through the power transistors and switching off the power transistors when the current exceeds the upper limit, a manufacturer must test the current limiting circuit.

In some examples, the current limiting mechanisms are tested in an automated test environment (ATE). ATE can also be defined as automatic test equipment. ATE includes control hardware, sensors, and software that performs tests on the current limiting circuit and further collects and analyzes the test results. Some examples of ATE resources (e.g., test hardware, sensors, analog inputs and outputs, digital inputs and outputs, and software) include a computer, a digital signal processor (DSP) for analog testing, a test program/software operating on the computer, a probe head that touches a probe pad, a probe card or membrane probe to measure signal on a pin or pad of the circuit, etc. The ATE resources may have limited current capabilities. For example, the test hardware such as the current sources or current sinks, which are used for testing, can only provide milliamps of current.

In some examples, a power converter such as a buck converter, has an upper limit of current in the ampere range. For example, a power transistor of the power converter may conduct eight amperes of current, which is greater than milliamps of current. Therefore, it is difficult/not possible to test a current limiting circuit with ATE systems due to the ATE hardware having limited current capabilities. Further, manufacturers, designers, engineers, etc., design a scaled down version of a switching network in order for the ATE resources to properly test the current limiting circuit. For this purpose, it has to be rendered possible to turn on only a portion of the power transistor to test the current limiting circuit. In some examples, it is trivial to turn on only a portion of power transistors such as a low-side N-Channel MOSFET and a high-side P-Channel MOSFET. In examples disclosed herein, it is not trivial to turn on a portion of a the high-side N-Channel MOSFET.

To turn on only a portion of the power transistor to test the current limiting circuit, the power transistor of the power converter is split into two transistors, where the two transistors are coupled in parallel to each other. For example, one transistor may be 90 percent of the size of the original transistor and a second transistor may be 10 percent of the size of the original power transistor. In this manner, the ATE hardware can test the operation of the current limiting circuit by turning on only the smaller transistor which increases the impedance of the parallel connection of the two transistors. For example, by splitting the power transistor into two transistors, where one is large and the other is small, a ratio is created. The ratio corresponds to the ratio of the maximum allowed current that will conduct during a normal operation to the current the ATE resource is able to sink during a test mode operation.

For example, if the maximum allowed current is 10 amps during normal operation and the ATE resource can only sink 100 milliamps during current limit test mode operation, then the ratio is 100. In this manner, the smaller transistor is 1/100 the size of the original transistor and the bigger transistor is 99/100 the size of the original transistor. In this manner, the impedance of the small transistor is one-hundred times the impedance of the combination of the bigger transistor and the smaller transistor. Since the current limiting circuitry senses the voltage drop across the transistors, the current limiting circuitry will trip at 100 milliamps of load current if only the small portion is on (e.g., because the voltage drop across the small transistor at 100 milliamps is the same as the voltage drop across the parallel connection of big and small transistor at 10 amps). A gate controller operates to turn on only the small transistor when the current limiting circuit is being tested by the ATE resource.

Challenges may arise when designing a gate controller that is able to turn on both transistors when the power converter is in normal operation or one hundred percent mode operation and turn on only the small transistor and turn off the larger transistor when the power converter is being tested by an ATE system. Normal operation of the power converter includes turning on a high-side power transistor and turning off a low-side power transistor and turning on the low-side power transistor and turning off the high-side power transistor to provide a regulated output voltage to a load. one hundred percent mode operation is when the high-side power transistor is on one hundred percent of the time, and the voltage at the input of the power converter is provided to the output. Challenges arise due to the requirement that in normal or one hundred percent mode operation, the gate terminals of the two transistors (e.g., the big transistor and the small transistor) should have the same voltage potential in order for the current limiting circuit to work as intended, but in test mode operation, the gate terminals of the two transistors should not have the same voltage potential and the bigger transistor should be off while the smaller transistor should be on.

Examples disclosed herein include a gate controller that controls the connection between the two gate terminals of the transistors to achieve normal operation mode, one hundred percent operation mode, and test mode when required. For example, the gate controller includes a P-channel transistors (e.g., P-channel metal oxide semiconductor field-effect transistors (MOSFET) (PMOS)) based switch to control the connection between the two gate terminals of the bigger transistor and the smaller transistor. Examples disclosed herein also utilize one charge pump to assist the power converter to operate in one hundred percent mode. Additionally, the charge pump operates to turn on the small transistor during current limit test mode. A charge pump is similar to a switching regulator that delivers power to an output by only charging and discharging capacitors.

In some examples, multiple charge pumps are utilized in the gate controller to turn on power transistors, which can take up a large silicon area on a die (e.g., a small block of semi-conducting material on which a given functional circuit is fabricated). Also in some examples, two gate drivers are utilized to drive the gate terminals of the two transistors which takes up silicon area. The larger the area of the die, the more costly. Thus, examples disclosed herein decrease the area size of power converter and gate driver schematic by utilizing one charge pump, one gate driver, and the PMOS based switch of the gate controller.

FIG. 1 is a block diagram of an example voltage converter apparatus 100. The example voltage converter 100 includes an example switching network 102 coupled to an example gate driver 104. The example gate driver 104 includes an example first transistor 106 and an example second transistor 108, an example gate controller 110, and an example boot-strap capacitor (Cboot) 112 to boost (e.g., increase) a bias voltage to provide a current to a drain terminal of the example first transistor 106.

In FIG. 1, the example voltage converter apparatus 100 includes the example switching network 102 to step down an input voltage to a regulated output voltage to power a load. The example switching network 102 includes a plurality of power transistors to conduct current to flow into the switching network 102 to the load via an output 116 or block current from flowing to the load via the output 116. The example switching network 102 is coupled to receive a controlled voltage via the example first transistor 106, an input voltage 118, and a controlled voltage at node 126 via the example gate controller 110. The example switching network 102 operates in three main modes: normal mode, one hundred percent mode, and current limit test mode. When the example switching network 102 is operating in normal mode, the voltage on the switching node 124 is a square wave, similar to a pulse-width modulation (PWM) signal. When the example switching network 102 is operating in one hundred percent mode, the voltage on the output 116 is equal to the input voltage 118. When the example switching network 102 is operating in current limit test mode, the voltage at switching node 124 and output 116 are similar to the output during one hundred percent mode (e.g., the voltage at the SW node 124 is the input voltage 118 minus a voltage drop across the one or more high side drive transistors of the switching network 102).

In FIG. 1, the example voltage converter 100 includes the example gate driver 104 to receive an input signal (e.g., a PWM signal) from a controller integrated-circuit and a switchable bias voltage circuit 103 produce an amplified signal from the low-power input to inject into the gate terminals of the example MN0 106 and the example MN2 108. For example, the low-power input may be generated from a PWM generator. In some examples, the PWM signal is a control signal that controls the current conducting through the power transistors of the switching network 102. The PWM signal is a turn-on and/or turn-off signal generated to control the operation of the power transistors. A PWM signal is injected into the example gate driver 104 to be amplified and injected into the gate terminal of a switching transistor. The PWM signal is an oscillating signal varying in duty cycle. Alternatively, the PWM signal may vary in frequency, therefore noted as a Pulse Frequency Modulated signal (PFM).

The PWM and/or PFM signal injected into the gate driver 104 contains information pertaining to the turn on and/or turn off times of the transistor. For example, the gate driver 104 may be configured to provide a plurality of PWM signals to the transistors, wherein each PWM signal may be the same and turn on transistors simultaneously, or they may be different and turn on and off transistors in different time intervals. In other examples, the PWM and/or PFM signal injected into the gate terminal may contain information pertaining to the turn on and/or turn off times of any power switch.

In FIG. 1, the example voltage converter apparatus 100 includes the example gate driver 105 to receive a control signal (e.g., a PWM signal, PFM signal, etc.) from a controller and produce an amplified signal from the low-power input to inject into the gate terminals to control an operation of a portion of the switching network 102. For example, the gate driver 105 controls the operation of a low-side drive (LSD) transistor of the switching network 102. The example gate driver 105 may be a power amplifier on an integrated chip (IC) or on a discrete module. In other examples, the gate driver 105 may include a plurality of electrical components that work together to amplify a low-power input signal to turn on or turn off a LSD transistor of the switching network 102.

In FIG. 1, the example gate driver 104 includes the example first transistor 106 and the example second transistor 108. The example first transistor (MN0) 106 and the example second transistor (MN2) 108 are N-channel MOSFETs (NMOS). Alternatively, MN0 106 and MN2 108 may be P-Channel MOSFETs, PNP BJTs, NPN BJTs, etc. Alternatively, MN0 106 and MN2 108 may be a switch or any other type of power switching device.

An NMOS includes two current terminals and a gate terminal, wherein one of the current terminals is a drain terminal and the second current terminal is a source terminal. The gate terminal of an NMOS controls the current that conducts out of the drain terminal to the source terminal. The NMOS operates in a linear mode when the gate-to-source voltage (Vgs) is greater than a threshold voltage (Vth) of the MOSFET and when the drain-to-source voltage (Vds) is less than the Vgs minus the threshold voltage (e.g., Vgs>Vth; Vds<Vgs−Vth). When the NMOS is in triode mode, the current conducting through the drain terminal (Id) to the source terminal is dependent upon the amount of voltage applied to the gate terminal. For example, if Vgs is small, then little drain current conducts, but when Vgs is big, then more drain current conducts. The NMOS operates in a saturation mode when Vgs>Vth and when the voltage Vds is greater than the voltage Vgs minus the threshold voltage (e.g., Vgs>Vth; Vds>Vgs−Vth). When the NMOS is in saturation mode, the drain terminal and source terminal act like a current source. In linear mode, current conducting through the two terminals varies depending on an increasing Vds voltage once the voltage has exceeded the threshold for saturation. In saturation, the current varies depending on an increasing gate voltage. Lastly, the NMOS operates in a cut-off mode when the Vgs is less than the threshold voltage Vth. In cut-off mode, no drain current Id conducts through the terminals.

In the illustrated example, a drain terminal of the first transistor 106 is coupled to the example Cboot 112, a gate terminal of the example first transistor 106 is coupled to receive a first PWM signal (PWM), and a source terminal of the example first transistor 106 is coupled to a drain terminal of the example second transistor 108 at an example GATE_BIG node 122. In the illustrated example, a gate terminal of the example second transistor 108 is coupled to receive a second PWM signal (PWM2), and a source terminal of the second transistor 108 is coupled to a portion of the switching network 102 at a switch (SW) node 124.

In FIG. 1, the example gate driver 104 includes an example switchable bias voltage circuit 111 coupled to the example Cboot 112. The switchable bias voltage circuit 111 is a bias voltage supply that provides a voltage to the Cboot 112 depending on the PWM input at the PWM node 132 to the example gate driver 104. For example, a controller (e.g., a PWM generator) provides a high voltage signal to the gate driver 104 which initiates the switchable bias voltage circuit 111 to provide a voltage to the Cboot 112. In other examples, a controller provides a low-voltage signal to the gate driver 104 to cause the switchable bias voltage circuit 111 to short the Cboot 112 to ground, thereby removing the voltage provided to the bottom plate of the Cboot 112. The switchable bias voltage circuit 111 outputs a voltage that is corresponding to the value of the incoming PWM signal that is provided to the example gate driver 104. For example, if the incoming PWM signal is low, the switchable bias voltage circuit 111 grounds the bottom plate of Cboot 112. If the incoming PWM signal is a high (e.g., 1 volt), the switchable bias voltage circuit 111 applies a voltage to the bottom plate of the Cboot 112, thereby increasing the voltage at the boot strap node 120. The switchable bias voltage circuit 111 is initiated (e.g., outputs a high voltage) when the example voltage converter 100 is operating in normal mode or one hundred percent mode and the switchable bias voltage circuit 111 does not output a high voltage to the example Cboot 112 when the voltage converter 100 is operating in current limit test mode.

In FIG. 1, the example gate driver 104 includes the example gate controller 110 to enable the ATE test of the circuitry, which imposes an upper limit of current on the example switching network 102. For example, the gate controller 110 includes a plurality of transistors, which may work together to adjust the impedance of a transistor of circuitry depending on the mode of operation. Essentially, the example gate controller 110 controls the state of operation of the example switching network 102 because the gate controller 110 decides which gate terminals of the switching network 102 to pull up (e.g., increase the voltage to the output of the first transistor 106 or increase the voltage to the voltage at node 126). The example gate controller 110 is coupled to receive the input voltage 118 and determined to be coupled to receive the controlled voltage from the example first transistor 106 or the boosted voltage from the example Cboot 112.

In some examples, the gate controller 110 is to assist an ATE system in testing circuitry which imposes an upper limit of current on the switching network 102 for proper operation during current limiting. For example, an ATE system with limited current capabilities may be used to test the circuitry, therefore the gate controller 110 must be able to control a portion of the switching network 102, wherein the portion of the switching network will conduct a smaller amount of current than the whole switching network 102 would conduct. In order to be able to control (e.g., turn on and turn off) the whole switching network 102 or a portion of the switching network 102, the example gate controller 110 is to be coupled to receive either the boosted voltage or the controlled voltage. The example switching network 102 and the example gate controller 110 are described in further detail below in connection with FIG. 2.

In FIG. 1, the example gate driver 104 includes the example Cboot 112 to boost or increase a bias voltage. A capacitor is a two terminal electrical component which stores potential energy in an electric field. The example Cboot 112 includes a first capacitor terminal and a second capacitor terminal, the first capacitor terminal is coupled to a switchable bias voltage circuit 111 of the example gate driver 104 and the second capacitor terminal is coupled to the drain terminal of example MN0 106. A boot-strap capacitor acts to exceed the voltage output by the switchable bias voltage circuit 111 to twice the supply voltage (e.g., VIN 118) in order to enable the turning on of the high-side NMOS type power transistor of the switching network 102 when PWM signal at the PWM node 132 is HIGH (e.g., logic 1) and when the voltage at the SW node 124 equals the voltage at VIN 118.

In FIG. 1, the example MN2 108 of the example voltage converter 100 includes an example MN2 body diode 114 coupled between the MN2 drain terminal and the MN2 source terminal. A body diode is an intrinsic feature of a MOSFET formed by the PN junction between the drain terminal and a bulk region of a MOSFET, wherein the drain terminal is an n-type material and the bulk region is a p-type material for an NMOS transistor. As used herein, the PN junction is a boundary or interface between two types of semi-conductor materials, p-type and n-type, wherein the p-type includes "holes" and is considered positive and the n-type includes electrons and is considered negative. In some examples, a body diode is referred to as a parasitic diode, a back-gate diode, or an internal diode.

Figure 2:
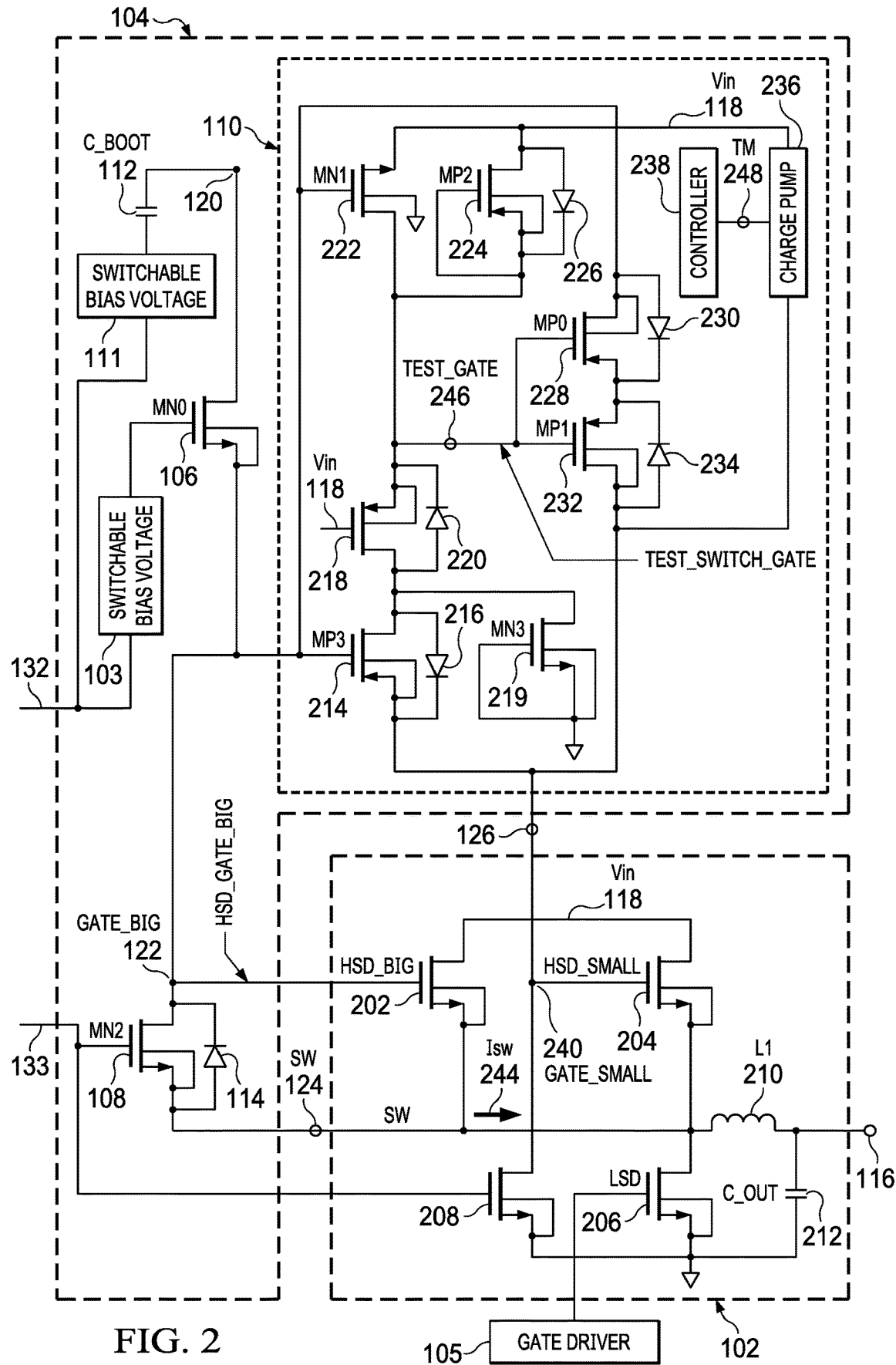
FIG. 2 is a schematic illustration depicting additional detail of the example voltage converter apparatus of FIG. 1.

FIG. 2 illustrates an example schematic of the example switching network 102 and an example schematic of the example gate controller 110 that overcomes the challenge of initiating the three operating states of the example switching network 102 (e.g., normal mode, one hundred percent mode, and current limit test mode). The illustrated example schematic of the gate controller 110 in FIG. 2 includes less power transistors relative to other gate controllers and one charge pump (CP), which decreases total die area (e.g., block of semiconducting material on which a given functional circuit is fabricated) relative to the gate controllers that utilize more charge pumps and transistors.

In FIG. 2, the example schematic of the example switching network 102 includes an example third transistor (HSD_BIG) 202, an example fourth transistor (HSD_SMALL) 204, an example fifth transistor (LSD) 206, an example pull_down transistor 208, an example inductor (L1) 210, and an example output capacitor (Cout) 212.

In FIG. 2, the example schematic of the example switching network 102 includes the example HSD_BIG 202 to conduct current from a drain terminal of the HSD_BIG 202 to SW node 124 to charge the example L1 210. The example HSD_BIG 202 includes the drain terminal coupled to the input voltage 118, a gate terminal coupled to GATE_BIG node 122, and a source terminal of the HSD_BIG 202 coupled to the source terminal of MN2 108, a drain terminal of low-side drive transistor 206, and the example L1 210 at the SW node 124. The example HSD_BIG 202 is a high-side drive NMOS which conducts large amounts of current (e.g., 1 amp to 8 amps) when a high voltage is applied to the gate terminal of HSD_BIG 202 (e.g., GATE_BIG node 122 is a high voltage). A high-side drive transistor, when enabled or activated, allows current to flow from supply (e.g., Vin), or a first phase voltage, through an inductor (e.g., L1 210) to an output capacitor (e.g., Cout 212), thereby charging the output capacitor Cout 212 and increasing the output voltage.

In FIG. 2, the example schematic of the example switching network 102 includes the example HSD_SMALL 204 to conduct current, smaller than the current conducting through the drain terminal of HSD_BIG 202, from a drain terminal of the HSD_SMALL 204 to the SW node 124. The example HSD_SMALL 204 includes a drain terminal coupled to the input voltage 118, a gate terminal coupled to a drain terminal of an example eleventh transistor (MP1) 232 of the example gate controller 110; a drain terminal of the example pull down transistor 208; a source terminal of the example MP3 214; and the example charge pump 236, and an example source terminal coupled to a drain terminal of the example LSD 206 at the SW node 124 and coupled to an example inductor 210. The example HSD_SMALL 204 is the same transistor type as the HSD_BIG 202 except the HSD_SMALL 204 is smaller (e.g., less total channel width) than HSD_BIG 202, thereby having a higher impedance (e.g., the HSD_SMALL 204 cannot conduct as much current as HSD_BIG 204). For example, the conducting state of HSD_SMALL 204 is determined by an example twelfth transistor (MP1) 232 and the MP0 228 of the example gate controller 110, wherein the MP1 232 is configured to be coupled to the gate terminal of the HSD_BIG 202 and the gate terminal of HSD_SMALL 204 when the voltage converter 100 is to operate in normal mode or one hundred percent mode, and configured to remove the connection between HSD_BIG 202 and HSD_SMALL 204 when the voltage converter 100 is to operate in current limit test mode.

In FIG. 2, the gate terminal of the example HSD_BIG 202 and the gate terminal HSD_SMALL 204 are coupled together (e.g., when MP0 228 and MP1 232 are enabled).

For example, the HSD_SMALL 204 replicates the operation of HSD_BIG 202 (e.g., the HSD_SMALL 204 and HSD_BIG 202 operate in parallel). Thus the HSD_SMALL 204 and HSD_BIG 202 conduct current from their respective drain terminal that is generated by input voltage 118 to L1 210, thereby expanding the L1 210 magnetic field.

In FIG. 2, the example schematic of the example switching network 102 includes the example low-side drive transistor (LSD) 206 to conduct when the HSD_BIG 202 and HSD_SMALL 204 are not conducting. The example LSD 206 is an N-channel MOSFET that includes a drain terminal coupled to the source terminal of the example HSD_SMALL 204 at the SW node 124, the source terminal of HSD_BIG 202, the source terminal of MN2 108, and to the inductor L1 210. The example LSD 206 also includes a gate terminal coupled to the example LSD gate driver 105, and a source terminal coupled to ground. Additionally or alternatively, the example LSD 206 may be a P-channel MOSFET, a bipolar junction transistor (BJT), or any other type of power switching device. A low-side transistor, when enabled or activated, pulls the SW node 124 to ground, thus creating a negative voltage across inductor L1 210 and thereby decreasing the current (e.g., the magnetic field) flowing through L1 210.

In FIG. 2, the example schematic of the example switching network 102 includes the example pull_down transistor 208 to pull the voltage at GATE_SMALL 240 to ground when the digital signal at an second PWM node 133 goes high. For example, when MN2 108 discharges the voltage at GATE_BIG 122 to SW node 124, the pull_down transistor 208 discharges GATE_SMALL node 240 to ground. The example pull_down transistor 208 operates in a saturation mode when the voltage applied to the gate terminal is greater than the Vth of the example pull_down transistor 208 and when the voltage at GATE_SMALL node 240 is greater than the Vgs minus Vth. For example, when the pull_down transistor 208 is operating in saturation mode, the current at GATE_SMALL node 240 conducts to the source terminal of the pull_down transistor 208 and to ground, resulting in the voltage at GATE_SMALL node 240 to decrease. The example pull_down transistor 208 operates in cut-off mode when the voltage applied to the gate terminal is less than the Vth. For example, when little to no voltage is applied to the gate terminal of the example pull_down transistor 208, the voltage at GATE_SMALL node 240 depends on the output of the example gate controller 110 (e.g., node 126).

In FIG. 2, the example schematic of the example switching network 102 includes the example inductor 210 which is a two terminal electrical component that stores energy in a magnetic field when current flows through it. The example inductor 210 includes a first inductor terminal and a second inductor terminal, the first inductor terminal coupled to the source terminal of the example HSD_BIG 202, to the source terminal of the example HSD_SMALL 204, the source terminal of the example MN2 108, and the drain terminal of the example LSD 206 at the switch node 124, and the second inductor terminal coupled to the output capacitor Cout 212 at the output node 116. During a high side operation (i.e., the HSD_BIG 202 and/or HSD_SMALL 204 is/are conducting) energy is stored in the inductor 210. On the other hand, during low side operation (i.e., the LSD 206 is conducting) energy is discharged from the inductor 210 to ground. During low side operation of normal mode, the current flowing through the inductor L1 210 is reducing, thereby reducing the energy stored in its magnetic field of the example L1 210. The example inductor 210 creates a ripple current that occurs during the switching on and off of the HSD_BIG 202 and/or HSD_SMALL 204 and LSD 206. Both HSD_SMALL 204 and HSD_BIG 202 are connected to the inductor L1 210. As used herein, ripple current is defined as the peak-to-peak change in current during the on time of a switching transistor.

In FIG. 2, the example schematic of the example switching network 102 includes the example output capacitor Cout 212. The example Cout 212 is a two terminal electrical component which stores energy when a voltage is applied across its terminals (e.g., when there is a voltage difference between the top and bottom plates of the Cout 212). The example Cout 212 includes a third capacitor terminal and a fourth capacitor terminal, the third capacitor terminal is coupled to the second inductor terminal of the inductor L1 210.

The example switching network 102 is coupled to the example gate controller 110 to facilitate correct current limit operation in normal mode and in one hundred percent mode by shorting GATE_SMALL 240 with GATE_BIG 122 (e.g., via the enabled MP0 228 and MP1 232). The gate controller 110 facilitates one hundred percent mode operation by refreshing the potential at GATE_SMALL 240 and GATE_BIG 122 via the charge pump 236. Additionally, the gate controller 110 increases the combined impedance of HSD_BIG 202 and HSD_SMALL 204 in current limit test mode by disconnecting the connection (e.g., creating an open circuit) between GATE_SMALL 240 with GATE_BIG 122. In this manner, the charge pump 236 can output a voltage to the GATE_SMALL node 240 to on HSD_SMALL 204 without HSD_BIG 202 turning on also (e.g., while HSD_BIG 202 is off) to enable testing of the current limit circuitry with the limited current capabilities of the ATE resources.

In FIG. 2, the example schematic of the example gate controller 110 which includes an example seventh transistor (MP3) 214, an example eight transistor 218, an example thirteenth transistor (MN3) 219, an example ninth transistor (MN1) 222, an example tenth transistor (MP2) 224, an example eleventh transistor (MP0) 228, an example twelfth transistor (MP1) 232, and an example charge pump (CP) 236.

In FIG. 2, the example MP3 214, the example eighth transistor 218, the example MP2 224, the example MP0 228, and the example MP1 232 are P-channel MOSFETS. A P-channel MOSFET is on (e.g., current is conducting out of the drain terminal) when the voltage across the gate terminal and source terminal is less than a threshold voltage. A P-channel MOSFET operates in cut-off mode (e.g., current is not conducting from the drain terminal) when the source terminal-to-gate terminal voltage is less than a threshold voltage. Each of the example P-channel; MOSFETS MP3 214, eighth transistor 218, MP2 224, MP0 228, and MP1 232 include an example body diode. A body diode is an intrinsic diode formed in the body of a transistor due the PN junction between the p-material and the n-material of the transistor. For example, a transistor includes a body which refers to the bulk of the semiconductor in which the gate terminal, source terminal, and drain terminal are all connected. The body of a P-channel transistor creates an intrinsic body diode due to the PN junction formed between the n-material of the body and the p-material of the source terminal and drain terminal. The example MP3 214 includes a drain terminal coupled to the example eighth transistor 218, a gate terminal coupled to the source terminal of the example MN0 106, and a source terminal coupled to the example GATE_SMALL node 240 at node 126. The example eighth transistor 218 includes a source terminal coupled to an example TEST_GATE node (e.g., test gate node) 246, a gate terminal coupled to the input voltage 118, and a drain terminal coupled to the example MP3 214 drain terminal and the MN3 drain terminal of the example MN3 transistor 219.

In FIG. 2, the example MP2 224 includes an example drain terminal coupled to the input voltage 118, and an example gate terminal coupled to an example source terminal, wherein the source terminal is coupled to the example MN1 222 at the TEST_GATE node 246. The example MP0 228 includes an example drain terminal coupled to the example GATE_BIG node 122, an example gate terminal coupled to the TEST-GATE node 246, and an example source terminal coupled to the example MP1 232. The example MP1 232 includes an example source terminal coupled to the MP0 source terminal, an example gate terminal coupled to the TEST_GATE node 246, and an example drain terminal coupled to the CP 236 and to the node 126.

In FIG. 2, the example schematic of the example gate controller 110 includes the example MN1 222 to bias the voltage at the TEST_GATE node 246 when operating in normal operation to turn on example MP0 228 and example MP1 232. The example MN1 222 includes an example source terminal coupled to the input voltage 118, an example gate terminal coupled to the MP3 gate terminal (e.g., the MP3 gate terminal and the MN1 gate terminal are coupled to the MN0 source terminal and to GATE_BIG node 122), and an example drain terminal coupled to TEST_GATE node. In FIG. 2, an electrical effect of a body diode of the example MN2 222 has been reduced, or otherwise eliminated, by biasing the body of the transistor to ground. For example, MN1 222 does not have the effect of the intrinsic body diode because the intrinsic body diode is always reverse-biased. In this manner, the MN2 222 does not have the same effect as the body diodes of example MN2 108, example MP0 228, example MP1 232, example MP2 224, and example MP3 214. Body diodes are described in further detail below in connection with the example fourth body diode 220 of FIG. 2.

In FIG. 2, the example schematic of the example gate controller 110 includes the example charge pump 236 to charge the GATE_SMALL node 240 when a voltage is applied to an example enable pin. The example CP 236 is a dual purpose CP and is coupled to receive the input voltage 118 and includes an example output pin coupled the MP1 drain terminal as well as the GATE_SMALL node at node 126; the source of the example MP3 214; and the drain of the example pull down transistor 208, and further includes the example enable pin coupled to an example controller 238. The example CP 236 may be a charge-pump doubler. A charge-pump doubler is a charge pump that doubles the amount of input voltage 118 at the output voltage by stacking two capacitors, where one capacitor is coupled to the input voltage 118 and ground and the second capacitor is coupled to input voltage 118 and the output. Additionally or alternatively, the example CP 236 may be an unregulated or pre-regulated doubler, or a multi-capacitor/multi-gain boost CP. The example CP 236 is further illustrated in FIG. 7B.

The example schematic of the example gate controller 110 of FIG. 2 includes the example controller 238 to enable or disable the example CP 236. The example controller 238 may be an oscillator, a PWM generator, etc., which is configured to output some voltage onto TM node 248. For example, the controller 238 is configured to generate varying voltages and currents from a power source to an output (e.g., TM node 248).

The example schematic of the example gate controller 110 of FIG. 2 includes the example MN3 219 to provide over voltage protection for transistor 218 and transistor 214 of the example gate controller 110. The example MN3 219 is an NMOS includes an MN3 gate terminal coupled to an MN3 source terminal and ground. Additionally, the MN3 219 includes an MN3 drain terminal coupled to the drain terminal of the transistor 214 and the drain of the transistor 218.

The example voltage converter apparatus 100 includes three operating modes, as described above in connection with FIG. 1. The three operating modes are normal mode, one hundred percent mode, and current limit test mode. The example switching network 102 and the example gate controller 110 operate together in a manner to achieve one of the three different modes of operation of the example voltage converter apparatus 100.

In a normal operating mode, the example switching network 102 of FIG. 2 provides a regulated output voltage to a load via the output node 116 and the example gate controller 110 ensures that GATE_BIG node 122 and GATE_SMALL node 240 are shorted together to ensure that current limit circuitry operates as intended. The example normal mode operation begins when the switchable bias voltage circuit 103 applies a voltage to the MN0 gate terminal based on the PWM signal at the PWM node 132. For example, when Vbias is zero volts the voltage at the boot strap node 120 is five volts and the switchable bias voltage circuit 103 amplified the incoming PWM signal at the PWM node 132 to ten volts at the MN0 gate terminal, the example MN0 106 turns on and the charge at the boot strap node 120 flows from the MN0 drain terminal to the MN0 source terminal, which is coupled to the MP3 gate terminal, MN1 gate terminal, MP0 drain terminal, and to the GATE_BIG node 122. The example C_BOOT 112 has not begun the boot-strapping operation.

Concurrently, the example input voltage 118 is applied to MP2 drain terminal and to the example fourth body diode 226. In normal operation mode, the input voltage 118 forward biases the example fourth body diode 226 and charges the TEST_GATE node 246 to the input voltage 118 minus the voltage drop of the fourth body diode 226. For example, if the input voltage 118 is five volts and the body diode 226 is a silicon diode, then five volts minus the voltage drop across the fourth body diode 226 is about is 4.3 volts. Thus, the TEST_GATE node 246 is charged to 4.3 volts. A silicon diode operating as forward bias has a voltage drop of 700 millivolts because of the inherent depletion region of the PN junction. When the diode is forward biased, the p-type material is coupled to a positive terminal such as an input voltage 118 and the n-type material is coupled to a negative terminal such as a terminal not receiving voltage. In this manner, when the voltage is applied to the p-type material, the electrons of the n-type material are forced over the PN junction (e.g., the interface) and some are lost in the process, thus causing the voltage drop across the diode. In other examples, a diode may be less than or greater than 700 millivolts, such as a Schottky diode, a germanium diode, a light emitting diode, etc.

In FIG. 2, when bootstrapping has not occurred, the example MP3 214, the example MP0 228, and the example MP1 232 are turned off because the MP3 214, MP0 228, and MP1 232 have a Vgs above the threshold voltage. The respective gate-to-source voltages of MP3 214, MP0 228, and MP1 232 are above the threshold voltage because during normal operation mode, the example CP 236 is not enabled by the example controller 238. For example, the controller 238 outputs zero volts, a logic 0, etc., on the TM node 248 to not enable the CP 236 to double the input voltage 118 at the output. Further, there is no voltage at node GATE_SMALL node 240 because whatever voltage was there has been discharged to ground by the example pull_down transistor 208.

In FIG. 2, the example MP0 228 is turned off because the voltage on MP0 source terminal and the voltage on TEST_GATE 246 does not meet the threshold voltage required to turn on the P-channel MOSFET. For example, when the TEST_GATE node 246 has been charged to 4.3 volts, 4.3 volts are applied to the MP0 gate terminal. In such an example, the MP0 drain terminal is coupled to the MN0 source terminal, which is five volts. Thus, the Vgs of MP0 228 does not meet the Vth to turn on (e.g., 4.3 volts-5 volts=-0.7 volts).

In FIG. 2, when bootstrapping occurs, the example switchable bias voltage circuit 111 outputs a Vbias and the example C_BOOT 112 boosts the Vbias voltage to a higher voltage at the charge node 120. The second example switchable bias voltage circuit 103 outputs a voltage (e.g., when the signal at the PWM node 132 is high) to the gate of the example MN0 106 that is high enough to ensure that the MN0 transistor 106 is turned on. In this manner, the voltage at the MN0 gate terminal is greater than the voltage at node 120 to turn on the example MN0 106. Further, when the example MN0 106 is turned on, current conducts through the MN0 drain terminal to the MN0 source terminal Thus, the voltage at the MN0 source terminal is the same voltage at GATE_BIG node 122, MP3 gate terminal, MN1 gate terminal, and MP0 drain terminal. In response to the bootstrapping, the example MN1 222, the example MP0 228, and the example MP1 232 turn on and the example MP3 214 remains turned off. In this manner, the example MN1 222 will turn on, and bias the TEST_GATE 246 node to the input voltage 118. When the voltage at the TEST_GATE node 246 equals the input voltage 118, the value of the voltage at the TEST_GATE node 246 is applied to the MP0 gate terminal and the MP1 gate terminal which turns on the example MP0 228 and the example MP1 232. For example, the Vgs of both the MP0 228 and the MP1 232 are "negative" because the voltage at the MP0 source terminal and the MP1 drain terminal is greater than the voltage at the MP0 gate terminal and the MP1 gate terminal. The gate-to-source voltages of the MP0 228 and MP1 232 are negative because for a PMOS, the voltage at the gate terminal must be smaller than the voltage at the source terminal to turn on the PMOS (e.g., a differential potential between the gate and the source being negative turns on the two P-channel MOSFETS MP0 228 and MP1 232.

In this manner, the voltage at GATE_SMALL node 240 equals the voltage at GATE_BIG node 122. For example, the voltage at the MP0 drain terminal is equal to the voltage at the GATE_BIG node 122, and when the example MP0 228 turns on, that voltage (e.g., MP0 drain terminal voltage) charges the GATE_SMALL node 240 to be equal to the GATE_BIG node 122. The example GATE_BIG 202 and the example GATE_SMALL 240 are "shorted together" (e.g., the HSD_BIG gate terminal and the HSD_SMALL gate terminal are coupled to each other and receiving identical voltages). In this manner, the example voltage converting apparatus 100 is operating in normal mode because both of the HSD transistors (e.g., HSD_BIG 202 and HSD_SMALL 204) are on. Both of the HSD transistors (202 and 204) are turned on and their respective gates have the same potential, thus ensuring that the current limiting circuitry is operating as intended in normal mode (GATE_BIG=GATE_SMALL is a hard requirement for the current limiting circuitry to operate as intended in normal mode). The SW node 124 charges to the input voltage 118 when the example HSD_BIG 202 and the example HSD_SMALL 204 turn on and there is a positive voltage (e.g., the voltage at the SW node 124 is greater than the voltage at the output 116) across the inductor 210. Thus, the energy is stored in the example inductor 210 and the magnetic field of the inductor 210 expands.

In FIG. 2, the example gate driver 104 may reduce the voltage applied to the MN0 gate terminal and the MN2 gate terminal to turn off the transistors MN0 106 and MN2 108. For example, the gate driver 104 may be configured to be coupled to receive a control signal from a pulse-width modulation (PWM) generator. In some examples, the PWM signal is a control signal because it controls the current conducting through the transistors. The PWM signal is a turn-on and/or turn-off signal generated to control the operation of the transistors. A PWM signal is injected into a gate terminal of a switching transistor via the gate driver 104. The PWM signal is an oscillating signal varying in duty cycle. Alternatively, the PWM signal may vary in frequency, therefore noted as a Pulse Frequency Modulated signal (PFM). The PWM and/or PFM signal injected into the gate terminal via the gate driver 104 contains information pertaining to the turn on and/or turn off times of the switching transistor. For example, the PWM generator may be configured to provide a plurality of PWM signals to the example MN0 106 (e.g., via the switchable bias voltage circuit 103), the example MN2 108, and the example LSD 206, wherein each PWM signal may be the same and turn on the transistors simultaneously, or they may be different and turn on and off the transistors in different time intervals.

In FIG. 2, when the example gate driver 104 removes the voltage injected into the MN0 gate terminal, it may inject a voltage into the LSD gate terminal. For example, two different PWM signals may be 180 degrees out of phase (e.g., include the same frequency but operating in an opposite manner), wherein when the first PWM signal is high, the second PWM signal is low, and when the second PWM signal is high, the first PWM signal is low. In this manner, the HSD_BIG 202 and HSD_SMALL 204 are on when LSD 206 is off, and LSD 206 is turned on when HSD_BIG 202 and HSD_SMALL 204 are turned off. This occurs in normal operation mode because the gate driver 104 operates to regulate the voltage at the output node 116 by expanding the magnetic field in the example inductor 210 when the two high side transistors are turned on and collapsing the magnetic field of the example inductor 210 when the LSD 206 is turned on, releasing regulated voltage to a load.

In FIG. 2, the example schematics of the example switching network 102 and the example gate controller 110 act to turn on the example HSD_BIG 202 before turning on the example HSD_SMALL 204 when operating in normal mode. Turning on the example HSD_BIG 202 first enables the turning on of the example MP0 228 and the example MP1 232, which can be referred to as the switches that connect and/or disconnect the GATE_BIG node 122 and the GATE_SMALL node 240. During normal operation, when HSD_BIG 202 is turned on first, MP0 228 and MP1 232 automatically turn on. During test mode operation, when the charge pump 236 is turned on first to start charging the GATE_SMALL, MP0 228 and MP1 232 remain turned off automatically. Accordingly, the example gate controller 110 is "self-controlled." Because the structure of MP0 228 and MP1 232 makes the gate controller 110 self-controlled, the structure of the example gate controller 110 is simple and consumes little die area.

The second example operating mode is current limit test mode, wherein the example HSD_SMALL 204 of the example switching network 102 of FIG. 2 is permanently on, driven by the example gate controller 110. In this manner, the gate controller 110 increases the impedance of the switching network 102 by only turning on the HSD_S-MALL 204, which enables the testing of current limit circuitry, not disclosed herein, with just milliamps of current (e.g., as opposed to amperes of current), by utilizing hardware such as an ATE system.

The current limit test mode begins when the example controller 238 enables the example CP 236. For example, the controller 238 may output a logic 1 or a positive voltage to the enable pin of the CP 236, which activates the CP 236 to begin doubling the input voltage 118 at the output (e.g., the output of the CP 236 is coupled to node 126 and GATE_S-MALL node 240). In some examples, due to inherent capacitances at intermediate node 126 of the example voltage converter apparatus 100, the GATE_SMALL node 240 increases linearly when the CP 236 is activated. As used herein, inherent capacitance is the term used when describing the unavoidable response of the circuit components in the example schematics of the example switching network 102 and the example gate controller 110 when there is a change in electric potential (e.g., voltage).

When the GATE_SMALL node 240 begins to increase due to the charging at the output of the example CP 236, the voltage at SW node 124 follows the voltage at GATE_S-MALL node 240 because the voltage at SW node 124 is equal to the voltage at GATE_SMALL node 240 minus the Vth of HSD_SMALL 204. As the voltage at GATE_SMALL node 240 increases to the input voltage 118 plus Vth, the voltage at the SW node 124 reaches the input voltage 118 and stays at the input voltage 118 (e.g., the voltage at the SW node 124 cannot surpass this voltage due to the drain terminal of HSD_SMALL 204 equaling the input voltage 118). The voltage at GATE_SMALL node 240 continues increasing until the voltage is approximately two times the input voltage 118, bringing HSD_SMALL 204 into linear mode (e.g., Vgs−Vth>Vds; as Vgs=Vin and Vds is very small). The voltage drop across the example HSD_SMALL 204 depends on the current of the drain terminal going into the ON resistance of the transistor (Rdson). Rdson is a term used to define the resistance of a MOSFET when the MOSFET is operating in linear mode. The voltage drop across a transistor in linear mode is Rdson times the current at the drain terminal (Id).

In response to the SW node 124 charging and GATE_S-MALL node 240 charging, the example first body diode 114 coupled to the example MN2 108 becomes forward biased, resulting in the current through the forward biased diode 114 charging the example GATE_BIG node 122. For example, the voltage at the GATE_BIG node 122 is one diode voltage below the voltage at the SW node 124, or in other examples, the voltage at the GATE_BIG node 122 is equal to the voltage at the SW node 124 minus the voltage drop across the example first body diode 114. Additionally, the example MN2 108 is not turned on because the example gate driver 104 is not applying a high voltage to the MN2 gate terminal.

When GATE_BIG node 122 is charged to equal one diode voltage below the voltage at the SW node 124, the example MP3 214 turns on. For example, the MP3 gate terminal is coupled to the GATE_BIG node 122 and the MP3 source terminal is coupled to the GATE_SMALL node 240, wherein the voltage at the MP3 gate terminal is a threshold voltage plus diode voltage less than the voltage at the MP3 source terminal, causing the MP3 214 to turn on. The voltage at the MP3 source terminal is across the MP3 drain terminal and further forward biases the example third body diode 220 that is coupled to the example eighth transistor 218. In this manner, the example third body diode 220 charges the TEST_GATE node 246 to be equal to one diode voltage below the voltage at the GATE_SMALL node 240. Because, the voltage at the TEST_GATE node 246 is applied to the MP0 gate terminal and the MP1 gate terminal, the example MP0 228 and the example MP1 232 are turned off (e.g., because the threshold voltages of MP0 228 and MP1 232 are greater than one diode voltage, 700 millivolts).

In the example current limit test mode, when the example CP 236 charges the GATE_SMALL node 240 to be equal to twice the amount of input voltage 118, the example HSD_S-MALL 204 enters linear mode. During the first half of the charging phase, HSD_SMALL 204 is in saturation mode (e.g., the voltage at the SW node 124 is one threshold voltage below the voltage at GATE_SMALL node 240). As the voltage at GATE_SMALL node 240 surpasses a total voltage equal to the input voltage 118 plus the threshold voltage and the voltage at the SW node 124 reaches the input voltage 118 potential, the example HSD_SMALL 204 enters linear mode. In this manner, the voltage at the SW node 124 forward biases the example first body diode 114. The example first body diode 114 charges the GATE_BIG node 122 to be equal to one diode voltage less than the voltage at the SW node 124 (e.g., the input voltage 118) because the example HSD_SMALL 204 is operating in linear mode and fully on).

The example MP3 214 enters linear mode during the beginning of the charging phase. The MP3 source terminal is shorted to the MP3 drain terminal and the voltage at the MP3 drain terminal equals the voltage at the GATE_S-MALL node 240. For example, the MP3 source terminal is coupled to the GATE_SMALL node 240 at node 126, and therefore, when the MP3 source terminal and MP3 drain terminal are shorted together, the MP3 drain terminal receives the voltage at the GATE_SMALL node 240. Further, the gate of the example eighth transistor 218 equals the input voltage 118. When the MP3 drain terminal exceeds the input voltage 118 plus threshold voltage, the eighth transistor 218 turns on (e.g., the eighth transistor source terminal is one threshold voltage greater than the eighth transistor gate terminal). When the eighth transistor 218 turns on, the voltage at the TEST_GATE node 246 is equal to the voltage at the MP3 drain terminal, and, the voltage at GATE_S-MALL node 240. When the TEST_GATE node 246 is charged to equal the voltage at GATE_SMALL node 240, the example MP0 228 and the example MP1 232 are in complete cut-off mode, wherein zero current is conducting through the example transistors 228, 232. For example, the MP0 drain terminal is coupled to the MP3 gate terminal, which is receiving one diode voltage below the input voltage 118, and the MP0 gate terminal is coupled to the TEST_GATE node 246, which is receiving two times the input voltage 118 (e.g., due to the CP 236 charging the GATE_S-MALL node 240), therefore the MP0 228 is turned off.

The example current limit test mode is achieved when the example MP0 228 and the example MP1 232 are operating in cut-off mode. For example, when MP0 228 and MP1 232 are operating in cut-off mode, the HSD_SMALL gate terminal is disconnected from the HSD_BIG gate terminal, and only the HSD_SMALL 204 is turned on. Thus, a higher impedance of the total high-side drive transistor is achieved, since only a portion of the total high-side drive transistor (e.g., HSD_SMALL 204) is on. In this manner, current limit circuitry, not disclosed herein, will trigger at a milliamp level of Isw 244 instead of an ampere level. The increase of the impedance (e.g., causing an increase of the voltage drop across the HSD_SMALL 204) aids to test the example current limit circuitry when the ATE system is limited to sinking milliamps of current. When the example current limit test mode is achieved, bootstrapping is not occurring, the example MN0 106 is not turned on, and the example HSD_BIG 202 is not turned on. The ATE system replaces the inductor L1 210 at the at the SW node 124 and acts as a current sink (e.g. loads HSD_SMALL 204) during current limit test mode. Now that the impedance of the parallel combination of HSD_BIG 202 and HSD_SMALL 204 has increased (e.g., since HSD_BIG 202 is off and HSD_S-MALL 204 is on), the voltage drop across HSD_SMALL 204 and HSD_BIG 202 which is necessary to trigger the current limit circuitry will occur at only milliamps of current as compared to amps of current during normal operation, which allows for the current limit circuitry to be properly tested by the ATE system.

Internal logic of the gate driver 104 determines when to exit current limit test mode by utilizing a second PWM signal at the second PWM node 133 to turn on the pull_down transistor 208. For example, when the second PWM signal at the second PWM node 133 goes high (e.g., logic 1, threshold voltage, etc.), the pull_down transistor 208 turns on and discharges the GATE_SMALL node 240 to ground. In this manner, the voltage at HSD_SMALL gate terminal is removed and HSD_SMALL 204 turns off.

Additionally, the example controller 238 assists to exit current limit test mode. The example controller 238 outputs a logic zero to TM node 248 to turn off the CP 236, which in turn discontinues charging the intermediate node 126 to only turn on HSD_SMALL 204 and keep HSD_BIG 202 off. When the switching network 102 has exited current limit test mode, normal mode or one hundred percent mode can be achieved.

The third example operating mode is one hundred percent mode, wherein the example high-side drive transistors HSD_BIG 202, HSD_SMALL 204 of the example switching network 102 of FIG. 2 are always on. The one hundred percent mode of operation begins in a similar manner as the normal mode of operation, wherein bootstrapping occurs to turn on the example HSD_BIG 202 and then turn on HSD_SMALL 204 by activating the example MP0 228 and the example MP1 232, and the example CP 236 is not enabled. In some examples, the C_BOOT 112 may begin to leak current. Leakage current is a small amount of current that leaks from one capacitor terminal to the second capacitor terminal, which results in a voltage loss and causes the energy stored in the capacitor to drain. In one hundred percent mode, leakage current may cause the example HSD_BIG 202 and the example HSD_SMALL 204 to turn off if enough charge is lost due to leakage.

In FIG. 2, the example CP 236 is enabled during one hundred percent mode to refresh the voltage at the GATE_SMALL node 240 and the voltage at the GATE_BIG node 122. For example, MP0 228 and MP1 232 are turned on and shorted together. In this manner, when the CP 236 is enabled, two times the input voltage 118 is injected into the HSD_S-MALL gate terminal and two times the input voltage 118 is injected into the HSD_BIG gate terminal, because the two gate terminals are shorted together by MP0 228 and MP1 232.

In FIG. 2, the example CP 236 is dual purpose because it operates to increase the voltage at GATE_SMALL node 240 in current limit test mode, and it operates to refresh the voltage at GATE_BIG node 122 and GATE_SMALL node 240 in one hundred percent mode. In some examples, the dual purpose CP 236 decreases area size of the example schematic because only one CP is needed and not two to perform the functions described above.

While an example manner of implementing the gate controller 110 of FIG. 1 is illustrated in FIG. 2, one or more of the elements, processes and/or devices illustrated in FIG. 2 may be combined, divided, re-arranged, omitted, eliminated and/or implemented in any other way. Further, the example controller 238 of FIG. 2 may be implemented by hardware, software, firmware and/or any combination of hardware, software and/or firmware. Thus, for example, the example controller 238 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example controller 238 is/are hereby expressly defined to include a non-transitory computer readable storage device or storage disk such as a memory, a digital versatile disk (DVD), a compact disk (CD), a Blu-ray disk, etc. including the software and/or firmware. Further still, the example gate controller 110 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
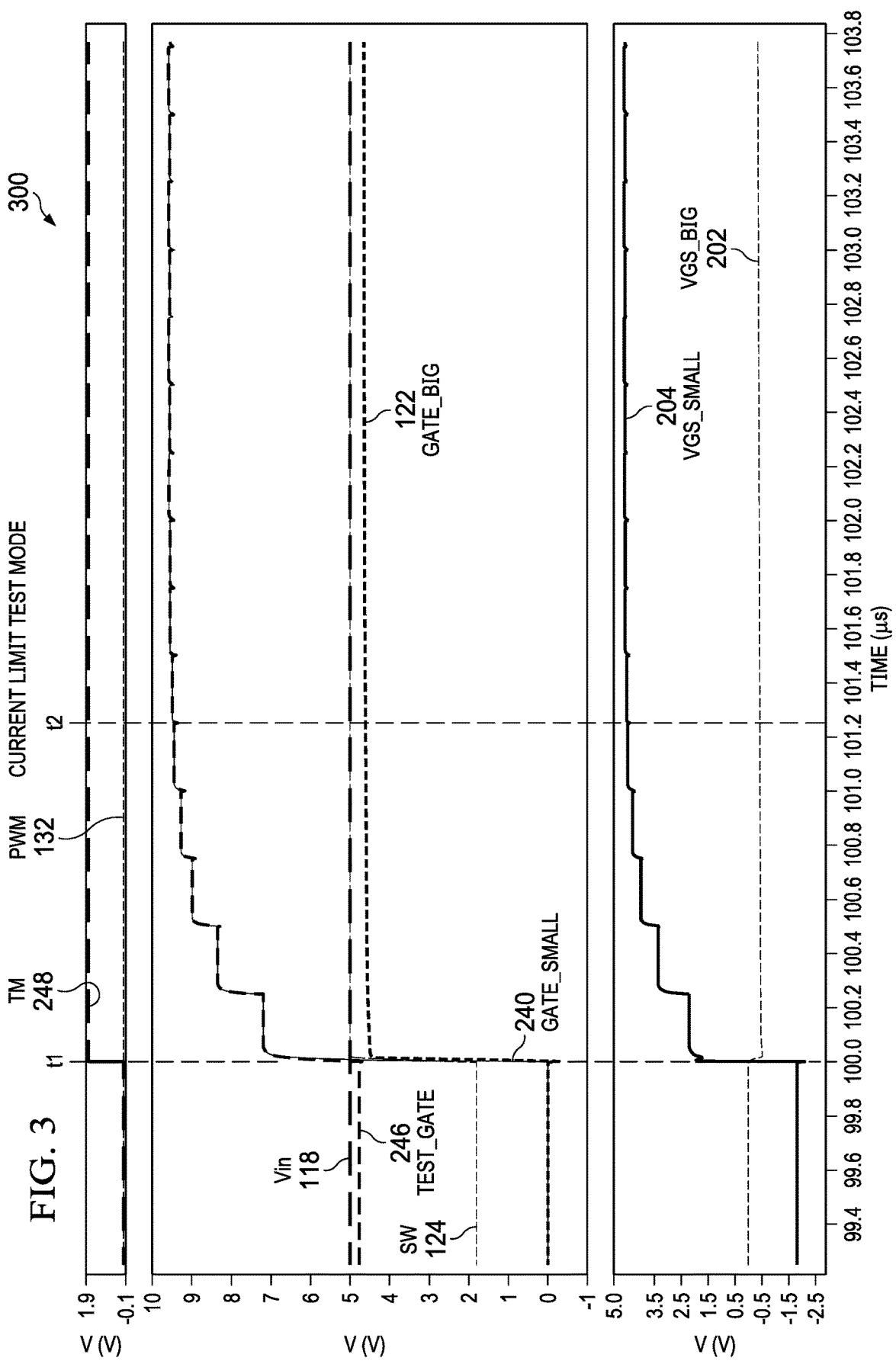
FIG. 3 is signal plot illustrating a transient response of the elements of the example voltage converter apparatus of FIG. 2 when operating in a first mode.
Figure 4:
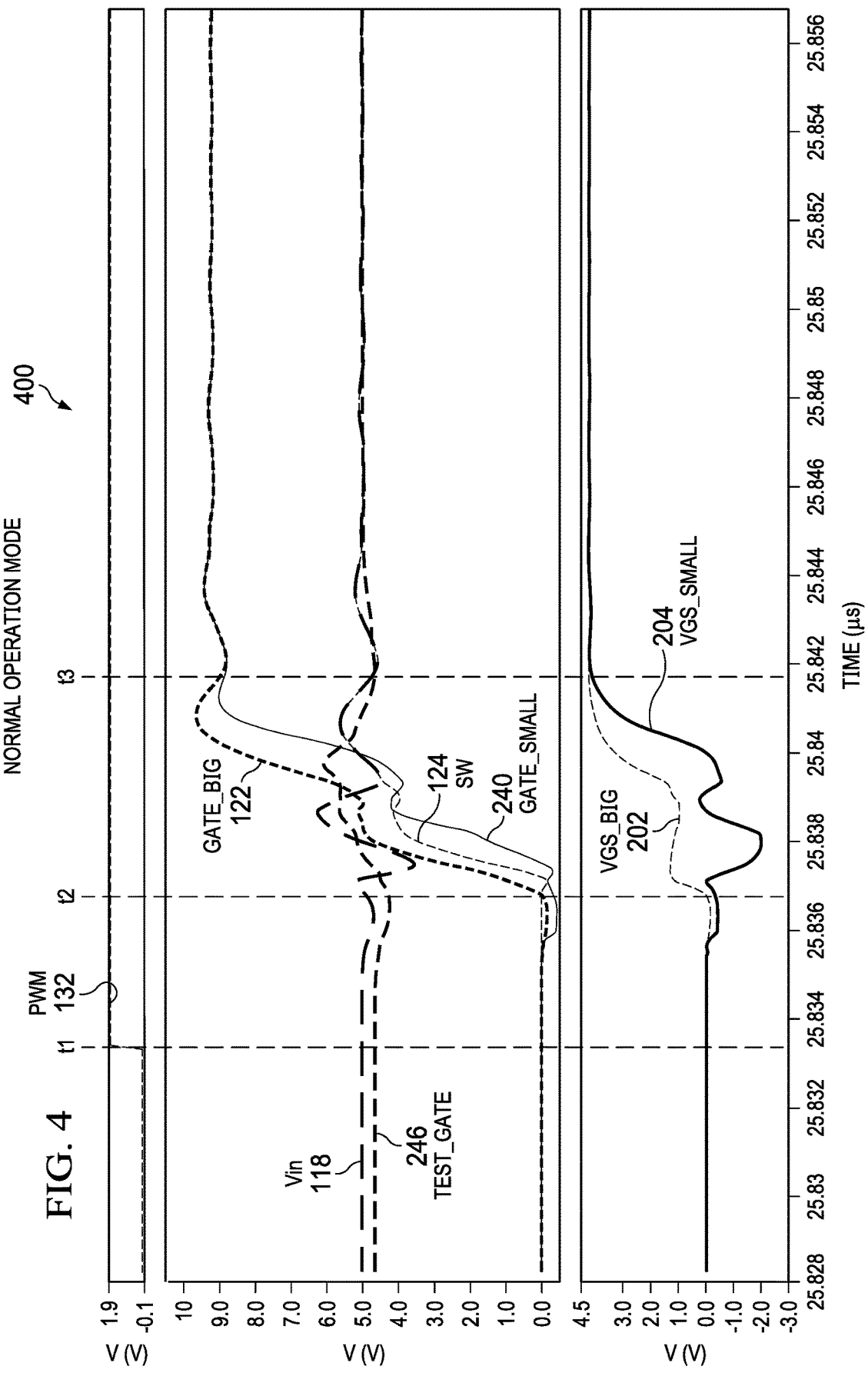
FIG. 4 is a signal plot illustrating a transient response of the elements of the example voltage converter apparatus of FIG. 2 when operating in a second mode.

FIGS. 3 and 4 are example signal plots corresponding to the example operations of the example voltage converter apparatus 100. FIG. 3 is an example first signal plot 300 corresponding to the current limit test mode operation of the example voltage converter apparatus 100. FIG. 4 is an example second signal plot 400 corresponding to the normal mode operation of the example voltage converter apparatus 100.

In FIG. 3, the example first signal plot 300 depicts the voltage through the example voltage converter apparatus 100 operating in current limit test mode. For example, the first signal plot 300 embodies the voltage at nodes TEST_GATE 246, GATE_BIG 122, GATE_SMALL 240, and the voltage at the SW node 124 when the example controller 238 outputs a logic one to the enable pin of the example CP 236 at the TM node 248 and when the example gate driver 104 does not output a high voltage at the PWM node 132 signal to the example MN0 106 (e.g., via the example switchable bias voltage circuit 103). In the current limit test mode, the input voltage 118 is 5 volts. However, the input voltage 118 is not limited to 5 volts.

In FIG. 3, before time t1, the TEST_GATE node 246 is charged to approximately 4.8 volts. For example, before the CP 236 is enabled, the 5 volt input voltage 118 is dropped across the fourth body diode 226 of the MP2 224, wherein the input voltage 118 forward biases the fourth body diode 226 and charges the TEST_GATE node 246 to equal one diode voltage below the input voltage 118. In this manner, the example fourth body diode 226 drops 200 millivolts. At time t1, the example HSD_BIG 202 and HSD_SMALL 204 are turned off (e.g., the Vgs_big 202 and Vgs_small 204 before time t1 are zero volts and below, indicating that voltage is not applied to HSD_BIG gate terminal and HSD_SMALL gate terminal).

In FIG. 3, at time t1, the example controller 238 outputs a logic high to the enable pin of the example CP 236 via TM node 248. In response to enabling the CP 236 at time t1, the voltage at the GATE_SMALL node 240 begins to increase. For example, the CP 236 includes an output coupled to the GATE_SMALL node 240 and provides voltage to the GATE_SMALL node 240 when enabled. The GATE_SMALL node increases from zero volts to about 7 volts at time t1 (e.g., it increases immediately). For example, due to inherent capacitance of the schematic of FIG. 2, the output of the CP 236 does not bring the voltage at node 240 up to two times the input voltage 118 immediately.

In FIG. 3, the example HSD_SMALL 204 begins to turn on as the gate-to-source voltage begins to increase. For example, at time t1, the Vgs_small 204 rises from approximately −2 volts to 2 volts when the GATE_SMALL node 240 is being charged by the output of the CP 236. When Vgs of the example HSD_SMALL 204 increases, the voltage across the transistor charges the SW node 124. For example, at time t1, the voltage at the SW node 124 rises to the input voltage 118 potential. The voltage at the SW node 124 rises to the input voltage 118 potential because the input voltage 118 is applied to the HSD_SMALL drain terminal, and when the Vgs of HSD_SMALL increases above the threshold voltage, the voltage at the HSD_SMALL drain terminal drops across the transistor to the SW node 124.

In FIG. 3, when the voltage at the SW node 124 increases to the input voltage 118 potential, the example first body diode 114 becomes forward biased and therefore provides voltage to the GATE_BIG node 122 and to the example MP3 gate terminal. For example, the first signal plot 300 illustrates the voltage at GATE_BIG node 122 rising to approximately 4.5 volts (e.g., one diode voltage below the voltage at the SW node 124) at time t1. In some examples, the voltage at the GATE_BIG node 122 does not meet the threshold voltage to turn on HSD_BIG 202, therefore, at time t1, the voltage across the gate-to-source of HSD_BIG 202 begins to decrease because the voltage at SW node 124 has risen due to HSD_SMALL 204 turning on.

In FIG. 3, at time t1, when the example first body diode 114 becomes forward biased, the voltage at the TEST_GATE node 246 begins to increase with respect to the output of the example CP 236. For example, the voltage at the MP3 gate terminal is one threshold voltage and one diode voltage lower than the voltage at MP3 source terminal (e.g., the voltage at the MP3 gate terminal is equal to voltage at GATE_SMALL node 240 voltage). Therefore, MP3 214 is in linear mode and the MP3 drain terminal is equal to the voltage at GATE_SMALL node 240. The example third body diode 220 is forward biased and voltage at TEST_GATE node 246 is one diode voltage below the voltage at GATE_SMALL node 240.

In current limit mode, when the TEST_GATE node 246 is charged to equal the output of the example CP 236, the Vgs_BIG 202 remains low because the MP0 228 and MP1 232 are off. For example, the CP 236 is not charging GATE_BIG node 122 and thus, HSD_BIG 202 remains off.

In FIG. 3, at time t2, the voltage at the TEST_GATE node 246 and the GATE_SMALL node 240 have stepped up to equal approximately two times the input voltage 118 and the Vgs_BIG 202 is still below zero volts, indicating that the example HSD_SMALL 202 is conducting current and the HSD_BIG 202 is turned off. In this manner, the impedance of the high-side drive transistor has increased. A voltage difference between the input voltage 118 and the SW node 124 triggers the current limit circuitry to be tested at milliamps of current (e.g., to be delivered by the ATE system) as opposed to amps of current during normal operation, thereby enabling ATE testing of the current limit circuitry.

In FIG. 4, the example second signal plot 400 depicts the voltage through the example voltage converter apparatus 100 when operating in normal mode. For example, the second signal plot 400 embodies the voltage at nodes TEST_GATE 246, GATE_BIG 122, GATE_SMALL 240, and SW node 124 when the example gate driver 104 receives a high PWM signal at the PWM node 132. In the normal mode, the input voltage 118 is 5 volts. However, the input voltage 118 may be set to another voltage.

In FIG. 4, the example second signal plot 400 depicts the PWM signal at the PWM node 132 going high at time t1. For example, the PWM signal 132 rises from zero volts to approximately 2 volts at time t2. The PWM signal 132 is generated by a PWM generator and is provided to the example switchable bias voltage circuit 103 to out a voltage sufficient to turn on the example MN0 106. The time between t1 and t2 depicts the propagation delay of the example gate driver 104. For example, the time between t1 and t2 is the time it takes for the example switchable bias voltage circuit 103 to level shift the PWM signal 132 to a value which turns on the example MN0 106. When the gate driver 104 receives a high PWM signal 132, it takes time (e.g., 0.00017 microseconds) for the approximately 2 volt signal to be increased to a value that is large enough to turn on MN0 106.

In FIG. 4, the example second signal plot 400 depicts voltage at GATE_BIG node 122 increasing at time t2. For example, the switchable bias voltage circuit 103 injects an amplified signal into MN0 gate terminal which turns on MN0 106 and further charges the GATE_BIG node 122 to equal the voltage at the node 120. When the example GATE_BIG node 122 is charged, the Vgs_BIG 202 increases which allows the input voltage 118 to discharge through the HSD_BIG drain terminal to the HSD_BIG source terminal. The voltage at the SW node 124 begins to increase in response to the Vgs_BIG 202 increasing as the example HSD_BIG 202 turns on.

Concurrently, the voltage at the TEST_GATE node 246 biases to the input voltage 118. For example, when the MN0 106 is turned on, MN1 222 turns on and conducts the input voltage to charge the TEST_GATE node 246. In the example second signal plot 400, the TEST_GATE node 246 follows the voltage at the input voltage 118. The input voltage 118 varies with respect to inherent capacitances and inductances in the circuitry of the example voltage converter 100.

In FIG. 4, the example second signal plot 400 depicts GATE_SMALL node 240 increasing at time t2 when the GATE_BIG node 122 increases. For example, when the voltage at the GATE_BIG node 122 is increasing, the voltage is simultaneously applied to the MP0 source terminal and the MN1 gate terminal, thus turning on the example MP0 228 and further turning on the example MP1 232. When MP0 228 and MP1 232 are turned on, MP0 228 and MP1 232 charge the voltage at node GATE_SMALL 240 to the voltage at node GATE_BIG 122, creating a short between GATE_BIG 122 and GATE_SMALL 240. In response to the voltage at the GATE_SMALL node 240 and GATE_BIG node 122 charging, the HSD_BIG 202 and HSD_SMALL 204 turn on and discharge the input voltage to the SW node 124. For example, the voltage at the SW node 124 begins to increase at time t2 with respect to the voltage at GATE_BIG node 122 and GATE_SMALL node 240 increasing.

In FIG. 4, the example second signal plot 400 depicts the voltage across Vgs_BIG 202 and Vgs_SMALL 204 increasing to a maximum potential at time t3. For example, at time t3, the voltage at each node 122 and 240 have increased to equal the voltage provided by the Cboot 112, and the voltage provided by Cboot 112 fully turns on the example HSD_BIG 202 and HSD_SMALL 204 as indicated by the gate-to-source voltage (Vgs) signals. At time t3, the charging of all nodes (e.g., GATE_BIG node 122 and GATE_SMALL node 240) is complete.

Figure 5:
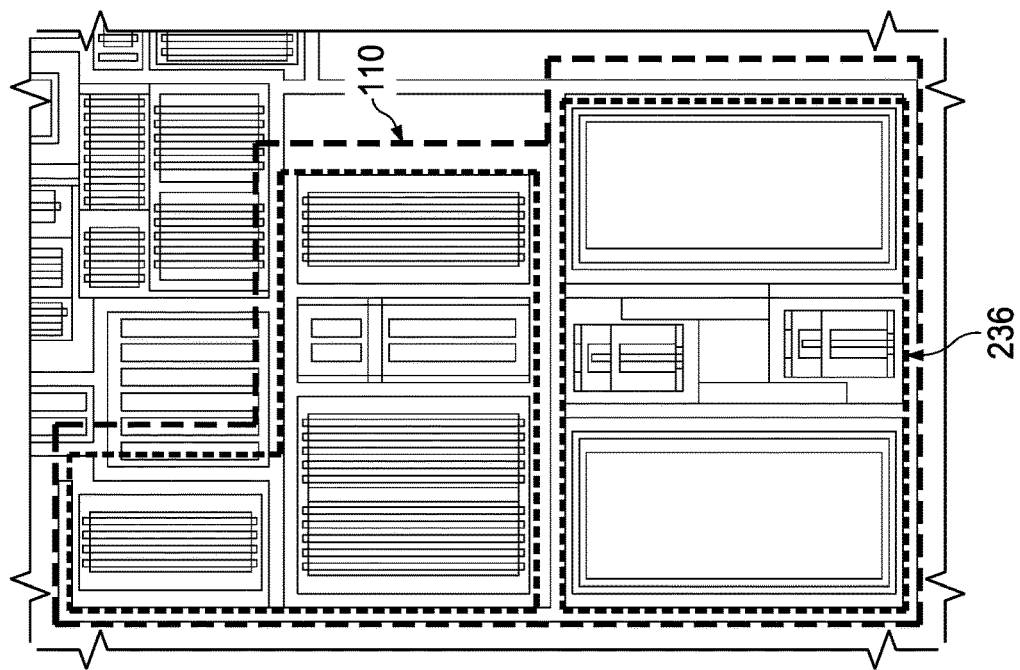
FIG. 5 depicts schematic illustrations of a test mode implementation circuit and an example gate controller of the example voltage converter apparatus of FIG. 2.
Figure 5:
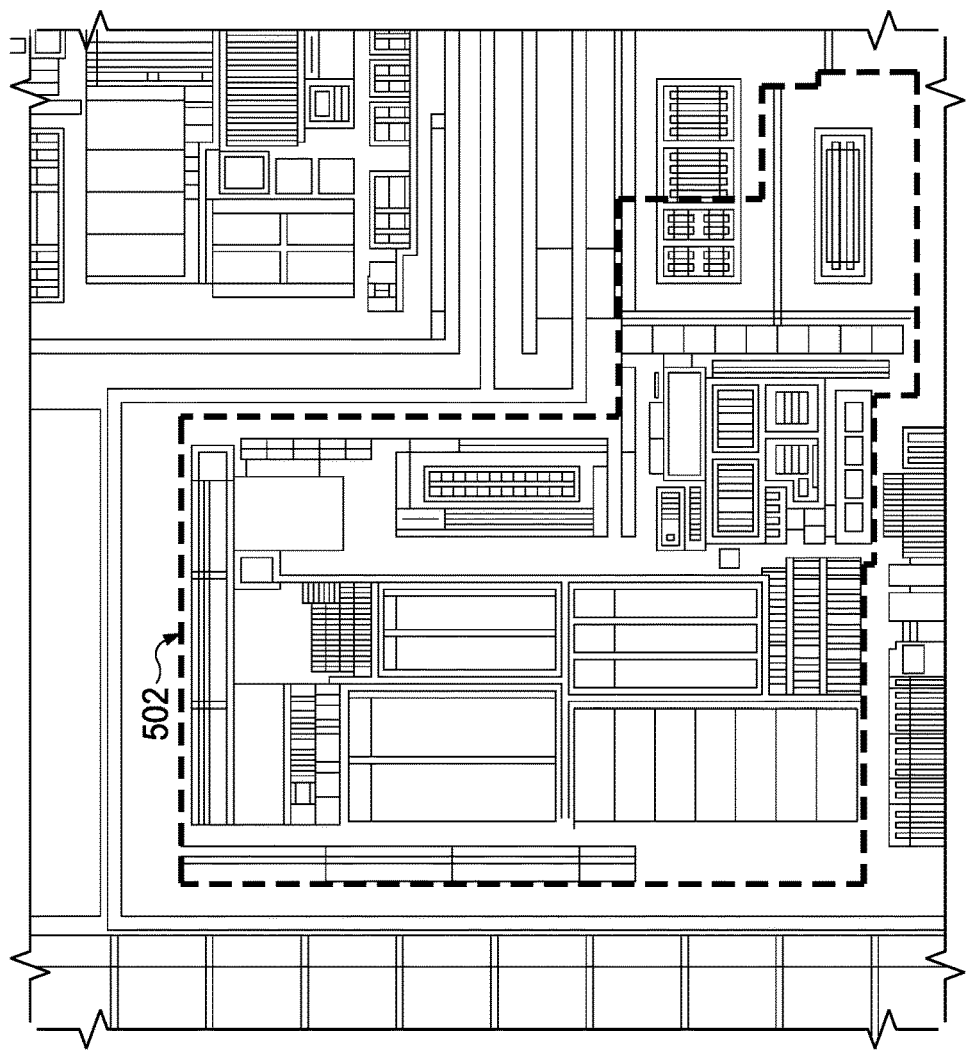

Turning to FIG. 5, a test mode implementation 502 and the example gate controller 110 are depicted in a silicon diagram to display the difference in total area size between the test mode implementation 502 and the example gate controller 110. For example, the test mode implementation 502 includes a test mode switch and a charge pump and operates to perform similar functions as that of the example gate controller 110. The test mode implementation 502 is greater in physical size than the example gate controller 110, even though they perform the same functions. For example, the test mode implementation 502 is approximately 11,670 square micrometers and the example gate controller 110 is approximately 2,310 square micrometers.

FIG. 5 illustrates an improvement of the example gate controller 110 over the test mode implementation 502 by minimizing the area size and number of components required to perform the functions of normal mode, one hundred percent mode, and current limit test mode. The reduction in die area consumption is due to a single charge pump (e.g., the charge pump 236) and minimizes production costs. The example gate controller 110 is able to connect and/or disconnect GATE_BIG and GATE_SMALL with less components and more simplicity than the example test mode implementation 502 (e.g., because MP0 228 and MP1 232 are self-controlled and do not require special level shifting). Accordingly, the example gate controller 110 is implemented in a smaller die area than the example test mode implementation 502. For example, the reduction in total number of components reduces the complexity of the gate controller 110 and likelihood that errors occur during building and operation. Thus, the decrease in the number of components and die area results in a decreased cost of implementing a circuit for normal, one hundred percent, and/or current limit test mode. The example gate controller 110 is approximately 9,360 square micrometers smaller than the test mode implementation 502. By including less components and being smaller in physical size, the example gate controller 110 generates less electromagnetic interference (EMI), dissipates less heat, includes a faster response time, and is cost efficient. In other examples, the gate controller 110 is cost efficient because there are fewer components required, such as one dual purpose charge pump (e.g., in the gate controller 110) versus two charge pumps (e.g., in the test mode implementation 502).

Figure 6:
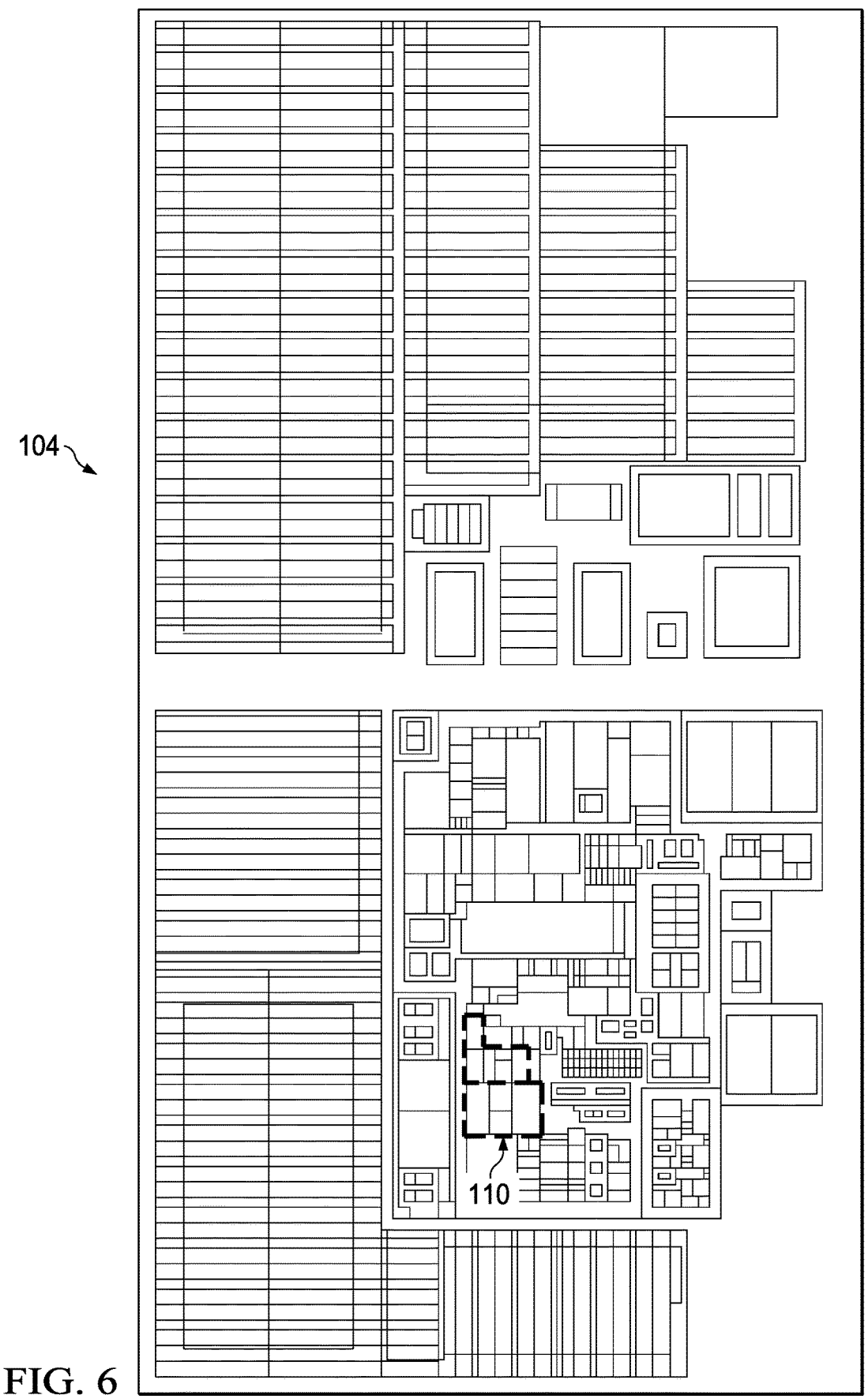
FIG. 6 depicts a schematic layout of an example gate driver including the example gate controller.

FIG. 6 illustrates a system layout 600 of the gate driver 104 which includes additional components and devices relative to the schematic illustrated in FIG. 2. The outlined gate controller 110 of the system layout 600 is depicted as a small portion of the high-side drive gate driver 104 which controls three modes of operation of the HSD transistor (e.g., HSD_BIG 202 and HSD_SMALL 204) of the switching network 102. The system layout 600 utilizes the plurality of electrical components to adjust the voltages provided to the HSD transistor of the switching network 102. The system layout 600 may be implemented as a separate module than the switching network 102 or may be implemented on the same IC as the switching network 102.

Figure 7:
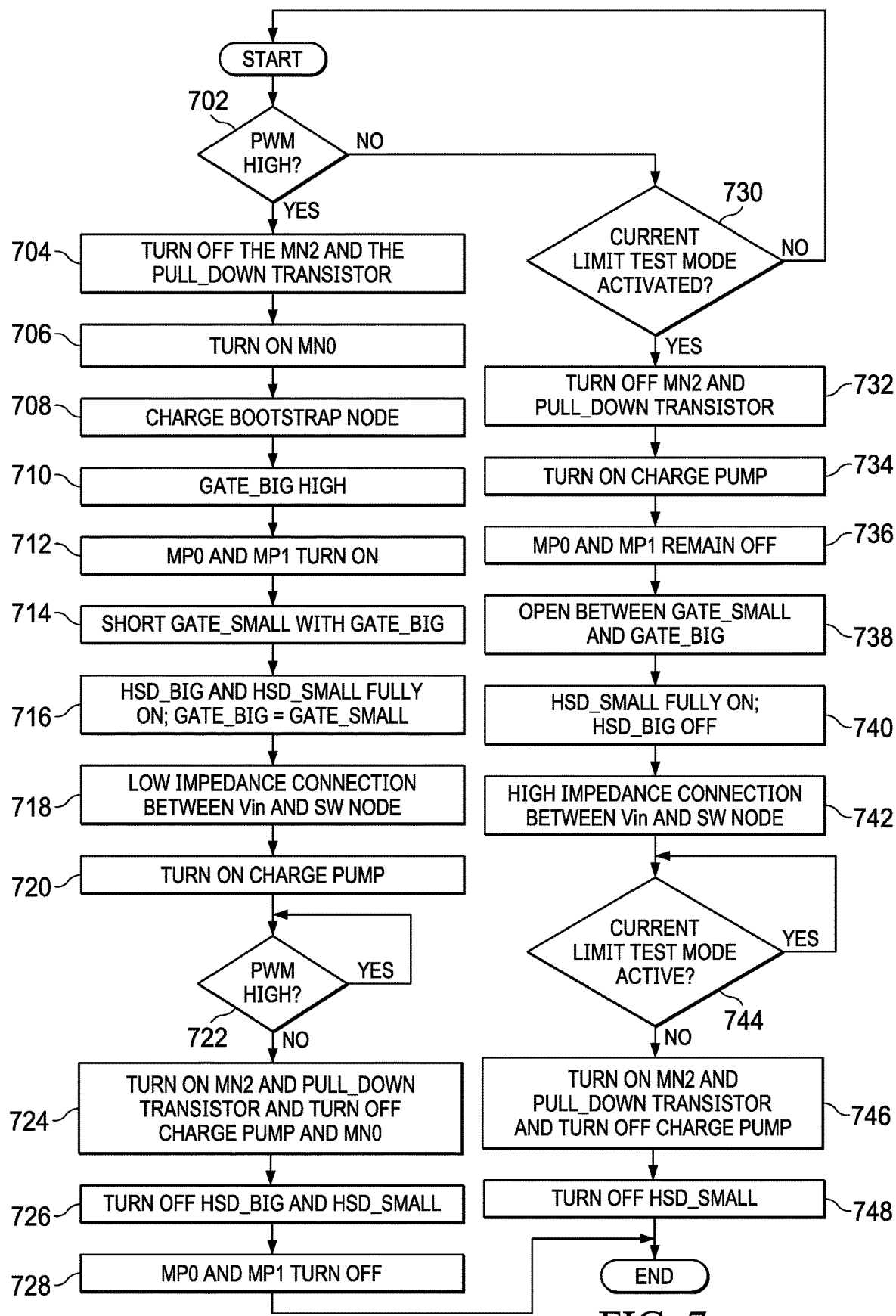
FIG. 7 depicts a flowchart representative of machine readable instructions which may be executed to implement the example gate controller of FIG. 2 to enable the first mode, the second mode, and a third mode of operation.

A flowchart representative of example hardware logic, machine readable instructions, hardware implemented state machines, and/or any combination thereof for implementing the voltage converter apparatus 100 of FIG. 2 is shown in FIG. 7. The machine readable instructions may be one or more executable programs or portion(s) of an executable program for execution by a computer processor. The program may be embodied in software stored on a non-transitory computer readable storage medium such as a CD-ROM, a floppy disk, a hard drive, a DVD, a Blu-ray disk, or a memory associated with the processor, but the entire program and/or parts thereof could alternatively be executed by a device other than the processor and/or embodied in firmware or dedicated hardware. Further, although the example program is described with reference to the flowchart illustrated in FIG. 7, many other methods of implementing the example voltage converting apparatus 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIG. 7 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

Turning to FIG. 7, the program 700 depicts an operation of the example gate controller 110 of FIG. 2 to operate in current limit test mode and one hundred percent mode. The program 700 of FIG. 7 begins at block 702 where the gate driver 104 determines the incoming PWM signal value at the at the PWM node 132. For example, the gate driver 104 receives a signal from a controller, oscillator, signal generator, etc., which is a low-voltage signal (LOW) or a high-voltage signal (HIGH).

When the PWM signal at the PWM node 132 is HIGH (e.g., block 702 returns a YES), the MN2 108 and the pull_down transistor 208 are turned off (block 704). For example, when the PWM signal at the PWM node 132 is HIGH, the second PWM signal at the second PWM node 133 goes LOW, such that the low-voltage signal turns off the MN2 108 and the pull_down transistor 208. Additionally, in response to the HIGH PWM signal at the PWM node 132, the MN0 106 turns on (e.g., the switchable bias voltage circuit 103 outputs a voltage sufficient to turn on the MN0 106 with the PWM signal is HIGH) (block 706).

The HIGH PWM signal at the PWM node 132 is also applied to the switchable bias voltage (SBV) circuit 111. The switchable bias voltage circuit 111 outputs switchable bias voltage to charge bootstrap node 120 (e.g., via the C_BOOT 112) (block 708). For example, a controller (e.g., a PWM generator) provides a high voltage signal to the gate driver 104 which initiates the switchable bias voltage circuit 111 to provide the bias voltage to the Cboot 112. When the bootstrap node 120 is charged (block 708), the MN0 106 charges GATE_BIG node 122 to go high (block 710). For example, the MN0 106 is turned on causing the voltage at the GATE_BIG node 122 to be equal to or substantially similar to the voltage at the bootstrap node 120.

Additionally, MP0 228 and MP1 232 turn on (block 712) in response to bootstrap node 120 charging. When MP0 228 and MP1 232 turn on, GATE_SMALL node 240 is pulled HIGH (e.g., the voltage at GATE_SMALL node 240 increases). For example, MP1 drain terminal is coupled to GATE_SMALL node 240 and charges GATE_SMALL node 240 when MP1 232 is turned on. In response to the MP0 228 and the MP1 232 turning on, GATE_BIG node 122 and GATE_SMALL node 240 are shorted together (block 714).

When the GATE_BIG node 122 and GATE_SMALL node 240 are shorted (block 714), HSD_BIG 202 and HSD_SMALL 204 are fully on (block 716). For example, the voltage applied to the GATE_BIG node 122 turns on HSD_BIG 202 and the voltage applied to the GATE_SMALL node 240 turns on HSD_SMALL 204. In this manner, GATE_BIG 122 is equal to GATE_SMALL 240.

When HSD_BIG 202 and HSD_SMALL 204 are both fully on (block 716), there is a low impedance connection between Vin 118 and SW node 124 (block 718). During operation (e.g., HSD_BIG 202 and HSD_SMALL 204 are turned on), the C_BOOT 112 may begin to leak current. In this manner, the CP 236 is turned on (block 720), and, because GATE_BIG 122 and GATE_SMALL 240 are shorted together by MP0 228 and MP1 232, the CP 236 replenishes the lost charge on both GATE_BIG 122 and GATE_SMALL 240 (block 714).

The CP 236 continues to refresh the voltage at GATE_BIG node 122 and GATE_SMALL node 240 when PWM signal at the PWM node 132 is HIGH (e.g., block 722 returns a YES). When the PWM signal at the PWM node 132 goes LOW (e.g., block 722 returns a NO), the MN2 108 and pull_down transistor 208 are turned on and the CP 236 and MN0 106 are turned off. For example, the second PWM signal at the second PWM node 133 goes HIGH and provides a turn-on voltage (e.g., a voltage value above Vth) to the MN2 gate terminal and the pull_down transistor gate terminal.

When MN2 108 and pull_down transistor 208 are turned on, the HSD_BIG 202 and the HSD_SMALL 204 turn off (block 726). For example, when the pull_down transistor 208 is turned on, the voltage at GATE_SMALL node 240 shorts to ground, thus removing the voltage from HSD_SMALL gate terminal and turning off HSD_SMALL 204. Additionally, when the MN2 108 is turned on, it discharges the GATE_BIG node 246 to the SW node 124. In this manner, the GATE_BIG node 122 shorts to SW node 124, thereby reducing the gate voltage of the HSD_BIG 202 and HSD_BIG 202 is turned off. When MN2 108 is turned on, the voltage at MP0 drain terminal is reduced to 0 volts, thus turning off MP0 228 and MP1 232.

If the gate driver 104 receives a signal from a controller, oscillator, signal generator, etc., which is a LOW (e.g., block 702 returns a NO) then the program 700 of FIG. 7 begins at block 730, where current limit test mode is determined to be activated. For example, when PWM signal at the PWM node 132 is LOW, the controller 238 (FIG. 2) may receive an initiating signal indicative to activate current limit test mode (e.g., block 730 returns a YES). In other examples, when PWM signal at the PWM node 132 is LOW, the controller 238 may not receive an initiating signal indicative to activate current limit test mode (e.g., block 730 returns a NO). In this manner, the example gate controller 110 continues to wait for a HIGH or LOW PWM signal at the PWM node 132 (block 702).

When current limit test mode is determined to be activated (e.g., block 730 returns a YES), a controller, such as a PWM generator, oscillator, signal generator, etc., turns off the example MN2 108 and pull_down transistor 208 (block 732). For example, the PWM signal 133 goes low and reduces the gate voltage of the MN2 gate terminal and pull_down transistor gate terminal to 0 volts, thereby turning off the MN2 108 and the pull_down transistor 208.

When the MN2 108 and pull_down transistor 208 are turned off (block 732), the controller 238 turns on CP 236 (block 734). For example, the controller 238 outputs a high voltage signal (e.g., greater than zero volts) to the enable input of the example charge pump 236 via the TM node 248. The output of the CP 236 charges the GATE_SMALL node 240. For example, when the charge pump 236 is enabled, the charge pump 236 operates to double the input voltage 118 at the output (e.g., the intermediate node 126).

When the CP 236 is charging, the voltage at the GATE_SMALL node 240, the MP0 228 and MP1 232 remain off (block 736). For example, MP0 228 and MP1 232 are, by default, turned off. Because the output of the CP 236 is coupled to the source terminal of MP3 214, the potential at the source terminal of MP3 214 becomes higher than the potential at the gate terminal of the MP3 214, thereby turning the MP3 214 on. Thus, the drain terminal of the MP3 214 receives the voltage at the GATE_SMALL node 240 and passes the voltage to the drain terminal of the eighth transistor 218. Once the voltage at the GATE_SMALL node 240 surpasses Vin plus the threshold voltage of the eighth transistor 218, the eighth transistor 218 turns on and passes the voltage at the GATE_SMALL node 240 to the TEST_GATE node 246 (e.g., the gates of the MP0 228 and the MP1 232). Thus the voltage at the GATE_SMALL node 240 is applied to the gate of MP1 232 and to the source of MP1 232. Because the Vgs of MP1 232 is zero volts, the MP1 232 is off. When MP0 228 and MP1 232 are both off, there is an open between GATE_SMALL node 240 and GATE_BIG node 122 (block 738). For example, MP0 228 and MP1 232 are the transistors that inherently act as the switch between the gate terminals of HSD_BIG 202 and HSD_SMALL 204 (e.g., the GATE_BIG node 122 and GATE_SMALL node 240), thus shorting or opening the connection between the two HSD transistors 202, 204.

When the CP 236 is charging GATE_SMALL node 240, creating an open between GATE_BIG node 122 and GATE_SMALL node 240, the HSD_SMALL 204 turns fully on and the HSD_BIG 202 is off (block 740). For example, there is no voltage charging GATE_BIG node 122, thus the voltage at HSD_BIG gate terminal is not great enough to turn the HSD_BIG 202 on. Because the output of the CP 236 is coupled to the source terminal of MP3 214, the potential at the source terminal of MP3 214 becomes higher than the potential at the gate terminal of the MP3 214, thereby turning the MP3 214 on. Thus, the drain terminal of the MP3 214 receives the voltage at the GATE_SMALL node 240 and passes the voltage to the drain terminal of the eighth transistor 218. Once the voltage at the GATE_SMALL node 240 surpasses Vin plus the threshold voltage of the eighth transistor 218, the eighth transistor 218 turns on and passes the voltage at the GATE_SMALL node 240 to the TEST_GATE node 246 (e.g., the gates of the MP0 228 and the MP1 232). Thus the voltage at the GATE_SMALL node 240 is applied to the gate of MP1 232 and to the source of MP1 232. Because the Vgs of MP1 232 is zero volts, the MP1 232 is off.

The example gate controller 110 operates to keep the HSD_BIG 202 off in current limit test mode because when HSD_BIG 202 is off, the impedance of the switching network 102 increases and the ATE hardware has the ability to test current limit circuitry without additional resources. For example, there is a high impedance connection between Vin 118 and SW node 124 (block 742). The high impedance connection is a result of the HSD_BIG 202 being turned off. Thus, HSD_BIG 202 acts as an open circuit between Vin 118 and SW node 124. Because HSD_SMALL 204 is on (e.g., creating a short circuit between Vin 118 and SW node 124), current will flow though HSD_SMALL 204 (as opposed to both HSD_SMALL 204 and HSD_BIG 202), thereby increasing the impedance between Vin 118 and the SW node 124. Additionally, HSD_SMALL 204 is a smaller transistor (e.g., smaller in physical size relative to the HSD_BIG 202) and a voltage difference between Vin 118 and SW node 124 which is sufficient to trigger the current limiting circuitry already occurs at milliamps of current (e.g., as opposed to amps of current when HSD_BIG 202 is turned on also). In this manner, current limiting circuitry can be tested with milliamps of current offered by ATE hardware.

The gate driver 104 may continue receiving an initiating signal indicative to active current limit test mode (e.g., block 744 returns a result YES) when operating in current limit test mode. If the gate driver 104 receives a signal indicative of inactive current limit test mode, the current limit test mode is to be no longer activated (e.g., block 744 returns a NO). In this manner, MN2 108 and the pull_down transistor 208 are turned on and the CP 236 is turned off (block 746) to remove the gate voltage from MP3 214 and HSD_SMALL 204, thus turning off MP3 214 and HSD_SMALL 204 (block 748).

The program 700 ends when the HSD_BIG 202 and HSD_SMALL 204 are both off. The program 700 may be repeated when the gate driver 104 receives a HIGH PWM signal at the PWM node 132 or when the gate controller 110 receives a signal indicative of instructions to activate current limit test mode of the gate driver 104.

From the foregoing, it will be appreciated that example methods, apparatus and articles of manufacture have been disclosed that reduce the number of components used to implement three modes of operation: normal mode, one hundred percent mode, and current limit test mode, for a switching network. The disclosed methods, apparatus and articles of manufacture increase the versatility of a switching network by implementing circuitry to perform multiple operations without requiring the need for a plurality of circuits to perform the multiple operations.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a switching network that includes a first high-side drive (HSD) transistor having a first HSD gate and a second HSD transistor having a second HSD gate, wherein the switching network has a current limit test mode, a normal mode and a one hundred percent mode; and
a gate controller having first and second switches and a third transistor, wherein the third transistor is coupled between the second HSD transistor and the second switch, the first and second switches are configured to connect the first HSD gate to the second HSD gate during at least one of the normal mode or the one hundred percent mode, and the gate controller is configured to turn on the second HSD transistor while the first HSD transistor is off during the current limit test mode.

2. The apparatus of claim 1, wherein the gate controller is configured to refresh a voltage applied to a gate terminal of the first HSD transistor responsive to the switching network operating in the one hundred percent mode.

3. The apparatus of claim 1, wherein the first HSD gate is disconnected from the second HSD gate responsive to the switching network being in the current limit test mode.

4. A system comprising:
a first transistor having first and second current terminals and a first control terminal;
a second transistor having third and fourth current terminals and a second control terminal, wherein the second control terminal is coupled to the first control terminal, and the third current terminal is coupled to the second current terminal;
a charge pump coupled between an input terminal and the fourth current terminal; and
a switching network coupled to the fourth current terminal, wherein the switching network includes a first high-side drive (HSD) transistor and a second HSD transistor, and the switching network has at least three modes of operation that include a current limit test mode.

5. The system of claim 4, wherein the at least three modes include a normal mode and a one hundred percent mode.

6. The system of claim 5, wherein the charge pump is configured to refresh a voltage applied to a gate terminal of the first HSD transistor while the switching network is operating in the one hundred percent mode.

7. The system of claim 4, wherein the first and second transistors are p-channel transistors.

8. The system of claim 4, further comprising a gate driver coupled to the switching network.

* * * * *